United States Patent
Stengel et al.

(10) Patent No.: US 7,162,000 B2
(45) Date of Patent: Jan. 9, 2007

(54) DELAY LOCKED LOOP SYNTHESIZER WITH MULTIPLE OUTPUTS AND DIGITAL MODULATION

(75) Inventors: Robert E. Stengel, Pompano Beach, FL (US); Joseph P. Heck, Ft. Lauderdale, FL (US); David E. Bockelman, Dripping Springs, TX (US)

(73) Assignee: Motorola, Inc., Schaumburg, IL (US)

( * ) Notice: Subject to any disclaimer, the term of this patent is extended or adjusted under 35 U.S.C. 154(b) by 753 days.

(21) Appl. No.: 10/050,233

(22) Filed: Jan. 16, 2002

(65) Prior Publication Data

US 2003/0152181 A1    Aug. 14, 2003

(51) Int. Cl.
H03D 3/24    (2006.01)
H03C 5/00    (2006.01)
H03L 7/00    (2006.01)
H03L 7/06    (2006.01)

(52) U.S. Cl. ............ 375/373; 375/268; 375/271; 375/320; 375/322; 375/300; 375/302; 327/141; 327/152; 327/153; 327/154; 327/155

(58) Field of Classification Search ........ 708/316; 375/371, 376, 322, 271, 373, 327, 354, 375; 327/158, 146, 155, 152, 156, 161, 183, 182, 327/269, 141, 147–150, 159; 370/503, 516, 370/517, 518, 215, 483
See application file for complete search history.

(56) References Cited

U.S. PATENT DOCUMENTS

| | | | |
|---|---|---|---|
| 4,290,022 A | 9/1981 | Puckette | |
| 4,742,563 A | 5/1988 | Fukumura | 455/132 |
| 4,965,810 A * | 10/1990 | Peischl et al. | 375/324 |
| 5,303,400 A | 4/1994 | Mogi | 455/186.1 |
| 5,451,894 A * | 9/1995 | Guo | 327/241 |
| 5,471,659 A | 11/1995 | Wong | 455/132 |
| 5,535,247 A | 7/1996 | Gailus et al. | 375/297 |
| 5,748,683 A | 5/1998 | Smith et al. | 375/347 |
| 5,913,155 A | 6/1999 | Tomiyama | 455/142 |
| 6,044,120 A | 3/2000 | Bar-David et al. | 375/347 |
| 6,100,735 A | 8/2000 | Lu | 327/158 |
| 6,148,186 A | 11/2000 | Fujita | 455/137 |
| 6,205,193 B1 | 3/2001 | Solve et al. | 375/354 |
| 6,226,505 B1 | 5/2001 | Uda | 455/255 |
| 6,236,690 B1 | 5/2001 | Mimura et al. | 375/334 |
| 6,353,649 B1 * | 3/2002 | Bockleman et al. | 375/376 |
| 6,510,191 B1 | 1/2003 | Bockelman | |
| 6,515,633 B1 | 2/2003 | Ippolito | 343/797 |
| 6,556,630 B1 | 4/2003 | Brinsfield et al. | 375/335 |
| 6,580,304 B1 * | 6/2003 | Rieven | 327/276 |
| 6,642,760 B1 * | 11/2003 | Alon et al. | 327/158 |
| 2002/0032042 A1 | 3/2002 | Poplawsky et al. | |

(Continued)

OTHER PUBLICATIONS

Jerry D. Gibson, "The Communications Handbook", 1997, CRC Press, p. 11.

*Primary Examiner*—Kevin Kim
*Assistant Examiner*—Linda Wong
(74) *Attorney, Agent, or Firm*—Barbara R. Doutre; Andrew S. Fuller

(57) ABSTRACT

A delay locked loop circuit (200) in which multiple outputs are produced. A single delay line (24) is shared among multiple tap selection circuits (256A, 265B, 265C). Fixed phase shifts (412) can be introduced between multiple outputs. A modulating signal can be used in the tap selection processing to produce digital amplitude, frequency and/or phase modulation.

43 Claims, 13 Drawing Sheets

U.S. PATENT DOCUMENTS

2002/0059352 A1* 5/2002 Nakase et al. .............. 708/316
2002/0110211 A1* 8/2002 Bockelman ................. 375/371
2002/0196061 A1* 12/2002 Atyunin et al. ............ 327/158
2003/0099321 A1* 5/2003 Juan et al. .................. 375/376
2003/0119465 A1 6/2003 Martin

* cited by examiner

DELAY LOCKED LOOP SYNTHESIZER WITH MULTIPLE OUTPUTS AND DIGITAL MODULATION

CROSS REFERENCE TO RELATED DOCUMENTS

This application is related to U.S. patent application Ser. No. 09/633,705 filed Aug. 7, 2000 to Frederick Lee Martin, entitled "Digital-To-Phase Converter" and in U.S. patent application Ser. No. 09/780,077 filed Feb. 9, 2001 to David Bockelman, entitled "Direct Signal Synthesizer Based on Delay Line with Sorted Taps" and in U.S. patent application Ser. No. 10/000,914 filed Nov. 2, 2001 entitled "Cascaded Delay Locked Loop Circuit" to Jui-Kuo Juan, which are hereby incorporated by reference.

FIELD OF THE INVENTION

This invention relates generally to the field of delay locked loop frequency synthesis and digital modulation. More particularly, this invention relates to a delay locked loop frequency synthesizer with multiple output signals, and to digital modulation.

BACKGROUND OF THE INVENTION

By appropriate selection of taps from a delay line in a delay locked loop (DLL), a frequency synthesizer can be realized. Frequency synthesizers using delay locked loops are described in the above-referenced patent applications.

Often it is desirable or required in an electronic circuit to generate multiple output signals at different frequencies. Heretofore, the only technique for generating such multiple frequency output signals using DLL technology would be the use of multiple delay locked loops. However, the power consumed and circuit complexity required to utilize multiple delay locked loops may be prohibitive.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
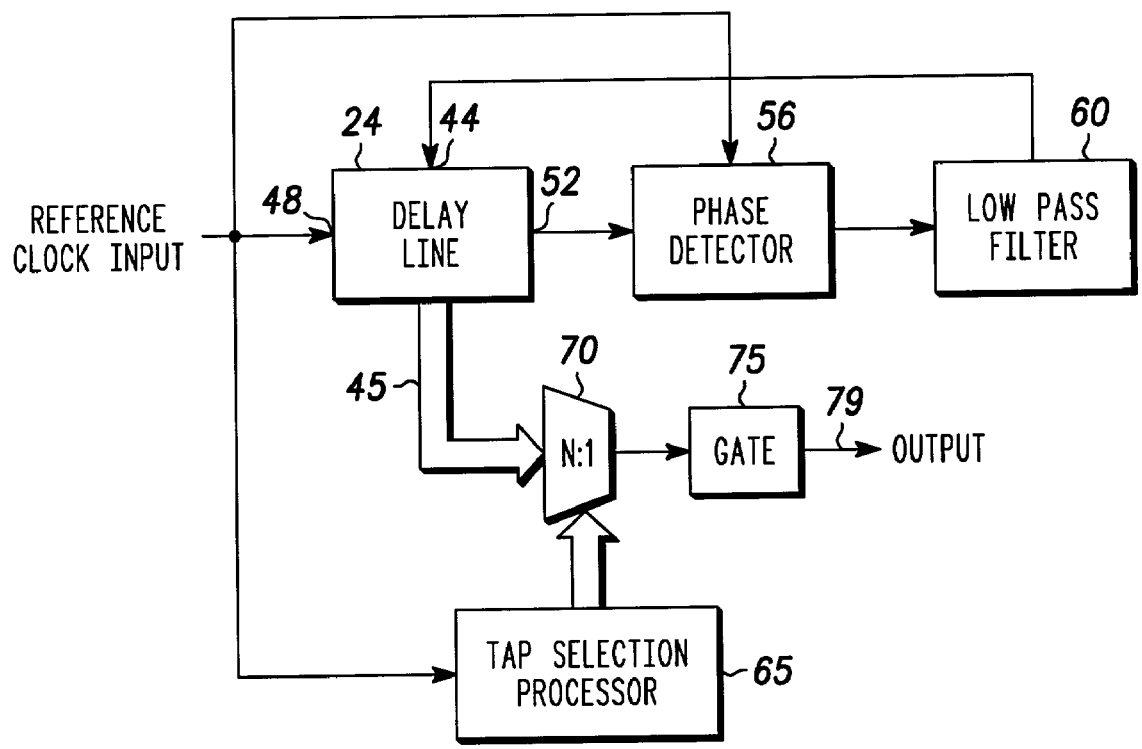
FIG. 1 is a block diagram of a delay locked loop structure.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Turning now to FIG. 1, a basic delay locked loop circuit 20 is illustrated. This circuit is similar to that found in the above-referenced patent applications. In this delay locked loop circuit 20, a delay line 24 is made up of a plurality of cascaded controlled delay elements, each having an input and an output. In delay line 24, N such delay elements are provided with each having a delay D. Such a delay line can be implemented using, for example, a series of inverter buffers each with a voltage controlled delay for adjustment of the value of D. Thus, delay line 24 has an overall delay of N×D. The overall delay of delay line 24 is tuned by a voltage (or other suitable control signal) applied to a control input 44. A suitable signal applied to input 44 simultaneously adjusts the delays of each of the N delay elements (which are preferably closely matched) to produce an overall adjustment in the delay N×D. A tapped output is available at each of the delay elements having a total amount of delay dependent upon the number of delay elements encountered from the input of the delay line 24. N such tap outputs are provided and shown as 45.

In delay locked loop 20, a clock signal is applied to an input 48 and, after encountering N×D delay, exits at output 52. The output at 52 and the input at 48 are each applied to a phase detector 56 that produces an output that represents the difference in phase between the two inputs. This output is filtered by a low pass filter 60. The output of the low pass filter 60 drives the control input 44 to effect a tuning of the delay line 24 so that the delay line 24 is adjusted to produce an output at output 52 that is a total of a predetermined delay from the input signal applied at input 48. One choice for the delay would be one input reference clock cycle or $1/F_{REF}$ seconds.

Those skilled in the art will appreciate that the delay locked loop 20 of FIG. 1 does not illustrate special circuitry sometimes used to prevent false locking. Such circuitry can be readily added if desired or needed without departing from the invention, but is not necessary to the understanding of the present invention.

In order to produce a signal having a frequency synthesized from the clock signal input at 48, a suitable combination of output signals from the delay line's tapped outputs 45 can be assembled to approximate the desired signal. Consider, for example and not by way of limitation, a delay locked loop circuit 20 having the following circuit parameters when locked:

Reference clock frequency=$F_{ref}$=450 Mhz
Number of delay elements=N=32
Average buffer delay=D=69.444 pico-seconds
Total Delay Line delay=N×D=2222.2 pico-seconds For this example 32 buffers or other suitable delay elements with 69.444 p second delay each are driven with a 450 MHz input clock signal and locked to a total delay of 2222.2 pico-seconds. Each of the taps supply a 450 MHz output signal with each tap having 11.25 degrees of offset (69.444 pico-seconds delay) from the preceding tap output.

The present circuit arrangement can be used to provide direct digital selectable signals with accurate time or phase shifted relation to the input clock signal. Each of the N+1 selectable signals from the delay line 32's tap outputs have a frequency and duty cycle equal to that of the input clock signal, but are shifted in time by a predictable delay. These time shifted output signals are selected using a tap selection processor 65 operating in an organized manner as a function of time to select a particular tap output from outputs 45 using multiplexer 70. This output is gated to provide an output signal 79 at a selected synthesized frequency. To achieve a desired output signal at a selected frequency, a suitable function is developed to select a specific set of output taps as a function of time. This function is carried out in the tap selection processor using any suitable algorithm. One such algorithm is described in the above referenced patent applications and is further described below, however, use of this particular algorithm should not be considered limiting since other algorithms for implementing tap selection can also be used without departing from the invention.

Continuing the example with a reference clock at 450 MHz and assuming a desired output signal of 375 MHz, an input to output frequency ratio is given by:

$$F_{ref}/F_{out}=K.C \quad K.C=450 \text{ MHz}/375 \text{ MHz}=1.2 \qquad \text{(Equation 1)}$$

So that:
K=1
C=0.2

Where K is the number of integer cycles and C is the fractional portion of cycles of the input reference clock $F_{ref}$ relative to the desired output signal $F_{out}$. In the algorithm for tap selection, K is the number of cycles of the input clock signal that pass before the tap is selected. The decimal value C defines the tap address for the first tap selection event. For purposes of this discussion, the tap number is considered the tap address. A new tap address $C_j$ is defined by adding the fractional portion C to the previous tap address $C_{j-1}$. This is repeated until an overflow occurs, i.e., until the new tap address is greater than or equal to 1. Upon an overflow event, an additional cycle of the input clock is allowed to pass and the fractional portion of the accumulated value is the new address. Thus, the tap address is given by:

$$\text{Tap Address}(j)_{Binary}=\text{RND}\{N\times\text{Frac}[\text{Sum}(C(j))]\} \text{ for}$$
$$j=0, 1, 2, 3, \ldots \text{ Until Tap Address}(j) \geq N$$

The implementation of this tap selection function can be accomplished with a phase accumulator function block operating in combination with a frequency accumulator function block. Such accumulators are similar to those used extensively in digital signal processing.

Selection of the output using the above algorithm involves selecting taps spaced by approximately C×N taps distributed across the delay line. On the first cycle, any tap could be selected to provide a time shifted offset from the reference clock signal. Returning to the example, assume the initial selection of tap 0 on the first cycle. Value C=0.2 is processed in an accumulation or summation with the initial first cycle offset of 0.0 for a second cycle result of 0.2. For this example with 32 or $2^5$ phase offsets (tap outputs), the exact delay would be represented by a tap position of 6.4. That is:

0.2/1.0=6.4/32.

Of course, only integer outputs are available, so rounding this to the closest integer results in selection of the $6^{th}$ tap. (Rounding is used in this example as a simple mechanism for approximating the exact tap value. Other techniques can also be used as will be discussed later.) The next accumulation value is given by:

0.2+0.2=0.4

Carrying out a similar calculation for 0.4/1.0 results in a tap position of 12.8 (that is, 0.4×32=12.8). This cycle, the integer rounding is up for the $13^{th}$ tap. This continues on with the fourth and fifth cycle accumulation of 0.6×32=19.2 and 0.8×32=25.6. These values round off to tap positions 19 and 26 respectively. On the sixth cycle, the accumulation overflows or becomes equal to or greater than one (with a remainder of zero for this example). Therefore, the process repeats every fifth cycle. Thus, in order to synthesize a 375 MHz clock signal, an output selection circuit is provided that sequentially selects taps $C_j$ for the output as illustrated in TABLE 1 in the order shown with x designating the clock cycle during which the tap is selected:

TABLE 1

| $C_j$ | 0 | 6 | 13 | 19 | 26 | 0 | 6 | 13 | 19 | 26 | 0 | ... |
|---|---|---|---|---|---|---|---|---|---|---|---|---|
| J | 0 | 1 | 2 | 3 | 4 | 0 | 1 | 2 | 3 | 4 | 0 | ... |
| x | 0 | 1 | 2 | 3 | 4 | 6 | 7 | 8 | 9 | 10 | 12 | ... |

As discussed previously, rounding can be used as a mechanism to approximate the exact tap value as in the example above. However, other rounding algorithms are possible that will improve performance with reduction in undesired spurious signal levels. Using tap 6.4 as an example, it could be rounded down to tap 6 six times out of ten tap cycles and rounded up to 7 four of the ten tap cycles. Thus, as described above, the delay line taps are selected to produce an output signal from a delay locked loop by computing an exact tap address P.Q where P is an integer part and Q is a fractional part and then selecting a delay line tap address of P during a portion of an operational cycle and of P+1 during a remainder of the operational cycle, with the regularity of selection of P and P+1 determined by an algorithm that establishes an average value of the tap address as approximately P.Q. In this method, the algorithm selects the value of P for 1−0.Q operational cycles and P+1 for 0.Q operational cycles as illustrated in the example above where P=6 and Q=4 so that out of an operational cycle of ten tap selections, the tap address is selected as P=6 for 10−Q=6 times and P+1=7 for Q=4 times.

More extensive tap selection algorithms can be used to extend the accuracy to additional digits if needed. Other algorithms can also be employed such as, for example, triangular interpolation or delta-sigma (or sigma-delta) processing, manipulation of C over the cycle time, etc. Such techniques can be applied to an individual tap or to a sequence of taps to enhance the long term average accuracy without departing from the invention. Thus, in a frequency synthesizer apparatus according to the present invention, the output control circuit can be designed to select taps based upon an algorithm that interpolates fractional tap values by selecting integer tap values that vary as the tap cycle repeats to enhance the accuracy of the frequency synthesis.

TABLE 2 below lists several additional examples of the sequence of taps used to generate various output signals by sequentially selecting taps for the output in the order shown using DLL 20 and an input clock frequency of 450 MHz (with the details left to the reader):

TABLE 2

| OUTPUT FREQUENCY | $F_{REF}/F_{OUT}$ | REPEATING TAP ADDRESS SEQUENCE |
| --- | --- | --- |
| 120 MHz | 3.75 | 0, 24, 16, 8, 0, 24, 16, 8, . . . |
| 300 MHZ | 1.5 | 0, 16, 0, 16, . . . |
| 600 MHZ | 0.75 | 0, 24, 16, 8, 0, 24, 16, 8, . . . |
| 1100 MHz | 0.4090909 . . . | 0, 13, 26, 7, 20, 1, 15, 28, 9, 22, 3, 16, 29, 10, 23, 4, 17, 31, 12, 25, 6, 19, 0, . . . |

These examples illustrate that the tap sequence can vary from a short sequence of taps to a very long sequence depending upon the frequency being synthesized and it's relationship to the clock frequency.

The number of taps in the tap sequence before the sequence repeats can be determined by reducing the frequency ratio $F_{ref}/F_{out}$ to its least common factors. The denominator integer of the lowest common factor in the ratio $F_{ref}/F_{out}$ is the length of the tap sequence before it repeats. For example, $F_{ref}$=450 MHz and $F_{out}$=1100 MHz, K.C=450×10⁶/1100×10⁶=9/22. Thus, there are 22 taps in the sequence before it repeats.

In cases where there are no common factors for both the input clock frequency and the output frequency, there may theoretically be no repeating sequence. Owing to the finite resolution of an accumulator, for most practical applications the pattern is likely to ultimately repeat, albeit after a very long sequence. It is also noted that the same sequence of tap addresses can be used to synthesize a number of different frequencies (e.g., 120 MHz and 600 MHz). This is because up to this point, the tap addresses have been defined, but there has been no determination as to when in time the tap addresses are selected to accomplish the desired frequency synthesis of $F_{out}$—only the tap addresses and the order of their selection have been defined. That is, nothing has been said regarding when any of the selected taps is to be addressed as an output.

In order to synthesize the frequency $F_{out}$ using the current DLL 20, an output signal from a selected tap is produced at increments in real time having a period defined by $1/F_{out}$. In order to accurately approximate this spacing using a single finite length delay line 24, one or more taps may have to be selected during each cycle of the input reference clock or, there may be cycles of the input reference clock in which no tap output is selected. In the above example where $F_{out}$ is 375 MHz and $F_{ref}/F_{out}$=K.C=450 MHz/375 MHz=1.2, the ratio K.C defines the time spacing in relation to a single reference clock cycle separating the selection of a tap to produce an output. That is, in this example, an output is produced every 1.2×N×D seconds. Thus, one tap output is selected every time 1.2×N×D seconds pass. If there is no initial phase offset, and the first tap selected is tap zero of delay line 24, TABLE 3 below defines the tap selection sequence as it relates to a given reference clock cycle for several of the example output frequencies assuming a first tap output of tap zero (i.e., no phase offset):

TABLE 3

| CLOCK CYCLE | 150 MHZ TAP SELECTION | 400 MHZ TAP SELECTION | 600 MHZ TAP SELECTION |
| --- | --- | --- | --- |
| 1 | 0 | 0 | 0, 24 |
| 2 | None | None | 16 |
| 3 | None | 6 | 8 |
| 4 | 24 | None | 0, 24 |
| 5 | None | 13 | 16 |
| 6 | None | None | 8 |
| 7 | None | 19 | 0, 24 |
| 8 | 16 | None | 16 |
| 9 | None | 26 | 8 |
| 10 | None | None | 1, 24 |
| 11 | None | 0 | 16 |
| 12 | 8 | None | 8 |
| 13 | None | 6 | 0, 24 |
| 14 | None | None | 16 |
| 15 | None | 13 | 8 |
| 16 | 0 | None | 0, 24 |
| 17 | None | 19 | 16 |
| 18 | None | None | 8 |
| 19 | 24 | 26 | 0, 24 |
| 20 | . . . | . . . | . . . |

Figure 2:
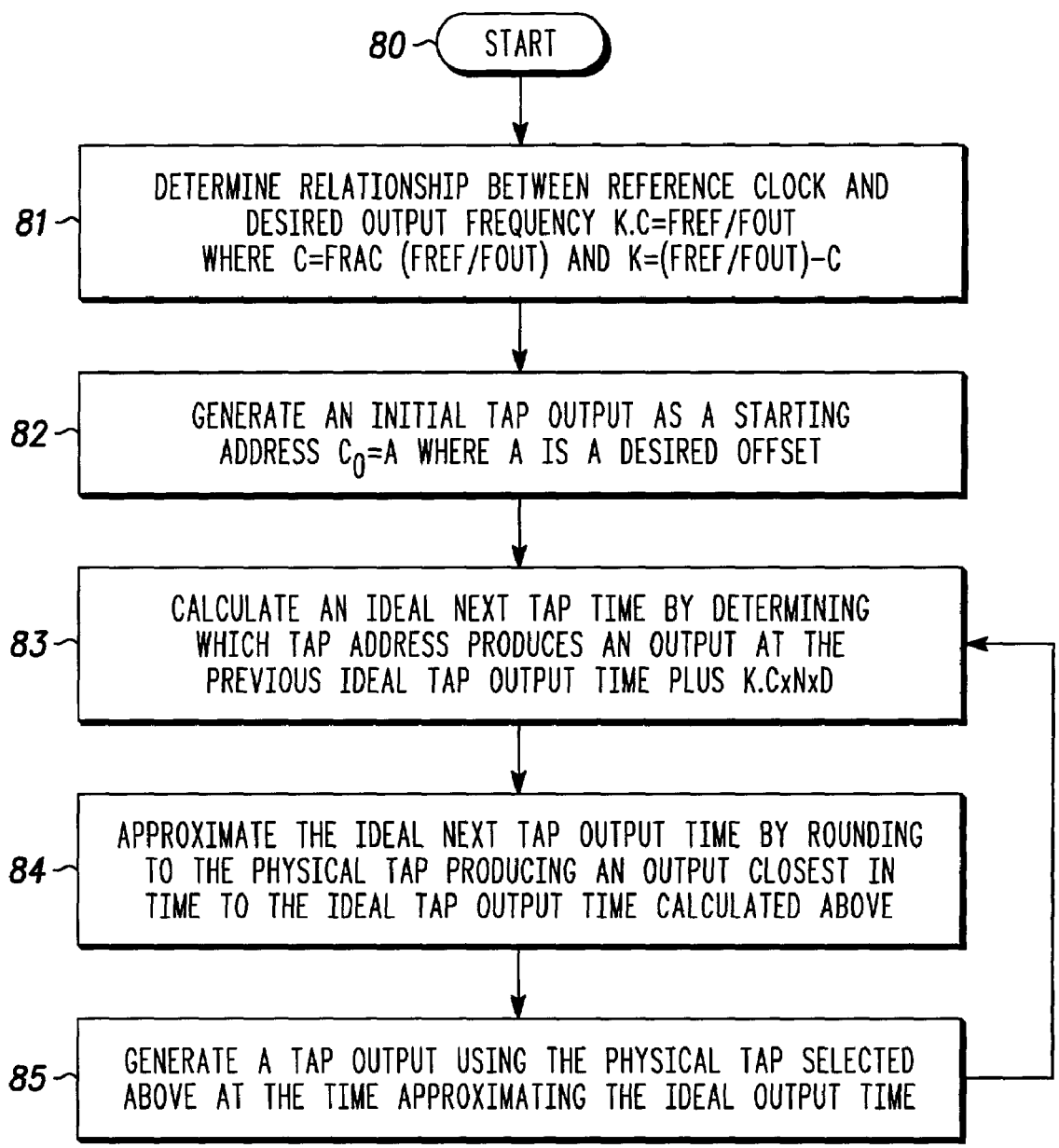
FIG. 2 is a flow chart broadly describing one tap selection algorithm.

FIG. 2 broadly depicts the above exemplary tap selection process starting at 80. At 81, the relationship between the input reference frequency and the desired output frequency is determined, for example by calculating $F_{ref}/F_{out}$=K.C. At 82, an initial tap address is selected as a starting output $C_0$=A, where A is any desired offset. At 83, a next ideal tap time is calculated by adding K.C×N×D (the frequency ratio times the total of the delay line; or the frequency ratio times the period of the reference clock) to the previous ideal tap time—in this case, the time of the output of $C_0$. Ideally, a tap producing an output at this time will be selected, but depending upon the actual time calculated, it may have to be approximated by the physical tap producing an output closest time to ideal at 84. The selected tap is then output during the reference clock cycle that results in the output occurring at the desired approximate time at 85. The process is then repeated for the next output by returning to 83.

To summarize, the output control circuit selects taps based upon an algorithm that computes a ratio K.C of the clock signal's frequency to a desired output frequency where C is a fractional part and K is an integer part of the ratio. The algorithm then identifies a sequence of taps at approximately equally spaced delay increments, wherein a $j^{th}$ tap address $C_j$ is defined by $C_j$=$C_{j-1}$+C. The taps are then sequentially selected to produce an output at time increments approximating K.C times the reference clock period.

While this process as described in conjunction with FIG. 2 suggests a dynamic selection of taps, this should not be considered limiting. Tap values for desired output frequencies can be pre-calculated and stored in memory or in a lookup table for use, or calculated as needed upon selection of an output frequency or selected dynamically as suggested by FIG. 3.

Figure 3:
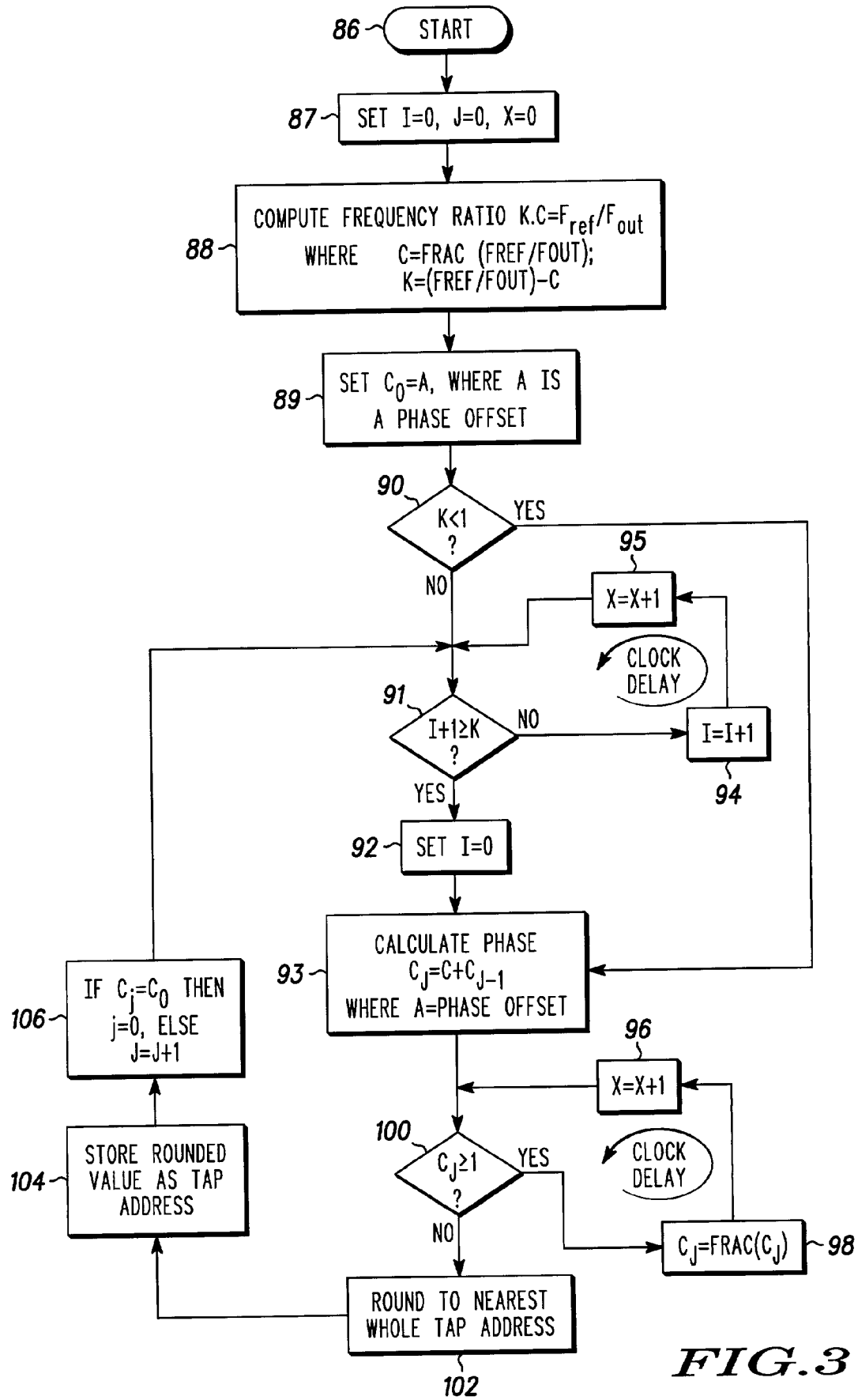
FIG. 3 is a flow chart describing a detailed tap selection algorithm.

A more detailed description of a tap selection algorithm that takes into account use of overflows in computing time between taps (due to the finite length of the delay line) is illustrated in FIG. 3. The process starts at 86 after which the values of counters j, x and i are initialized to zero at 87.

Counter i is a counter that counts whole cycles until K is reached to account for any whole cycles of delay needed in the event $F_{out}<F_{ref}$. The counter j represents a number of cycles of phase accumulation before the tap selection values repeat. The counter x counts the number of clock delays. The frequency ratio K.C is calculated at 88 for the desired output frequency. At 89, the initial tap address $C_0$ is selected to equal A, where A represents any phase offset value between 0 and 1. (In the examples given above, this value was set to 0 so that the first tap address is at the 0 tap position, but in general, any arbitrary phase offset between 0 and 1 could be used.) The tap addresses $C_j$ represents a normalized decimal tap address value between 0 and 1 which indexes the selected tap. In the case of a delay line with 32 delay elements, for example, a normalized decimal tap address of any value y between 0 and 1 would map to tap number y/32. When converted to binary, the most significant bits can serve as an address for the selected tap. In the 32 delay element example above, the five most significant bits of the tap address, when converted to binary, can directly address the appropriate tap address.

After the initialization of tap $C_0$, control passes to 91 where the value of K is compared to 1. If K<1, the process goes directly to 93 bypassing a loop made up of 91, 94 and 95, and the tap values selected require no intermediate delays between selection of the taps. If, however, K≧1 the process goes through the loop made up of 91, 94 and 95 one or more times depending upon the values of i and K. In the event $F_{ref} \geq F_{out} \geq F_{ref}/2$, i.e., when K=1 and i<1, then only one cycle of this loop is processed. Otherwise, multiple cycles are processed indicating that the output frequency is less than half the reference frequency, and additional delays between selected tap values may be needed.

Whenever i+1≧K at 91, control passes to 92 where the counter i is reset to value zero. The exact theoretical tap address (phase) is determined at 93 by adding C to the previous tap address in an accumulation process. Unless the decimal value of the phase is greater than or equal to 1 at 100, the phase is mapped to a tap address and is rounded to the nearest actual tap address at 102. At 104, this tap address is stored for use and the value of j is incremented at 106. If $C_j$ is greater than or equal to 1 at 100 (meaning a delay of greater than one clock cycle), the fractional portion of its value is retained at 98 and x is incremented at 96, and an additional clock cycle is processed (around the loop of 100, 98 and 96). After j is incremented or reset to zero at 106 (depending upon whether or not $C_j=C_0$), control returns to 91 where the process repeats until an overflow occurs at 91. Those skilled in the art will appreciate that many variations of this process can be realized without departing from the present invention.

Referring back to FIG. 1, the outputs from the N taps 45 can be selected using an N:1 multiplexer 70 operating under control of the tap selection processor 65 to produce the output at 79 as described above to produce a desired output signal. The output frequency can be selected using an accumulator as described above forming a part of a clocked logic circuit with an input controlled by a microcomputer in one example. In other embodiments, the selection can be made directly by a microcomputer or microcontroller, or can be hard wired, manually switched or determined from a lookup table. Other equivalent embodiments will be evident to those of ordinary skilled in the art upon consideration of the present discussion.

Of course, because of the rounding used to make the approximation, the output in the first example above does not provide a pure 375 MHz signal. While this may not be critical in many applications, it may cause problems in other applications. By way of example, and not limitation, in the case where the DLL is used to synthesize local oscillator signals for a radio frequency transmitter and/or receiver, the impurities of the 375 MHz signal can result in undesirable or unacceptable spurious transmissions and/or receiver responses.

In order to enhance the resolution of the DLL circuit, additional delay elements can be added, or a secondary delay element or elements can be used as described in the above-referenced patent application which has been incorporated by reference.

It is sometimes useful to synthesize output signals at several different frequencies simultaneously. Multiple synthesizers such as 20 can be used to produce multiple outputs, however, doing so can cause undesirable increases in cost and current drain. Thus, for example, to produce three separate frequencies using three synthesizers, current drain would be three times that of a single synthesizer, and might prove unacceptable (especially in battery powered applications).

Figure 4:
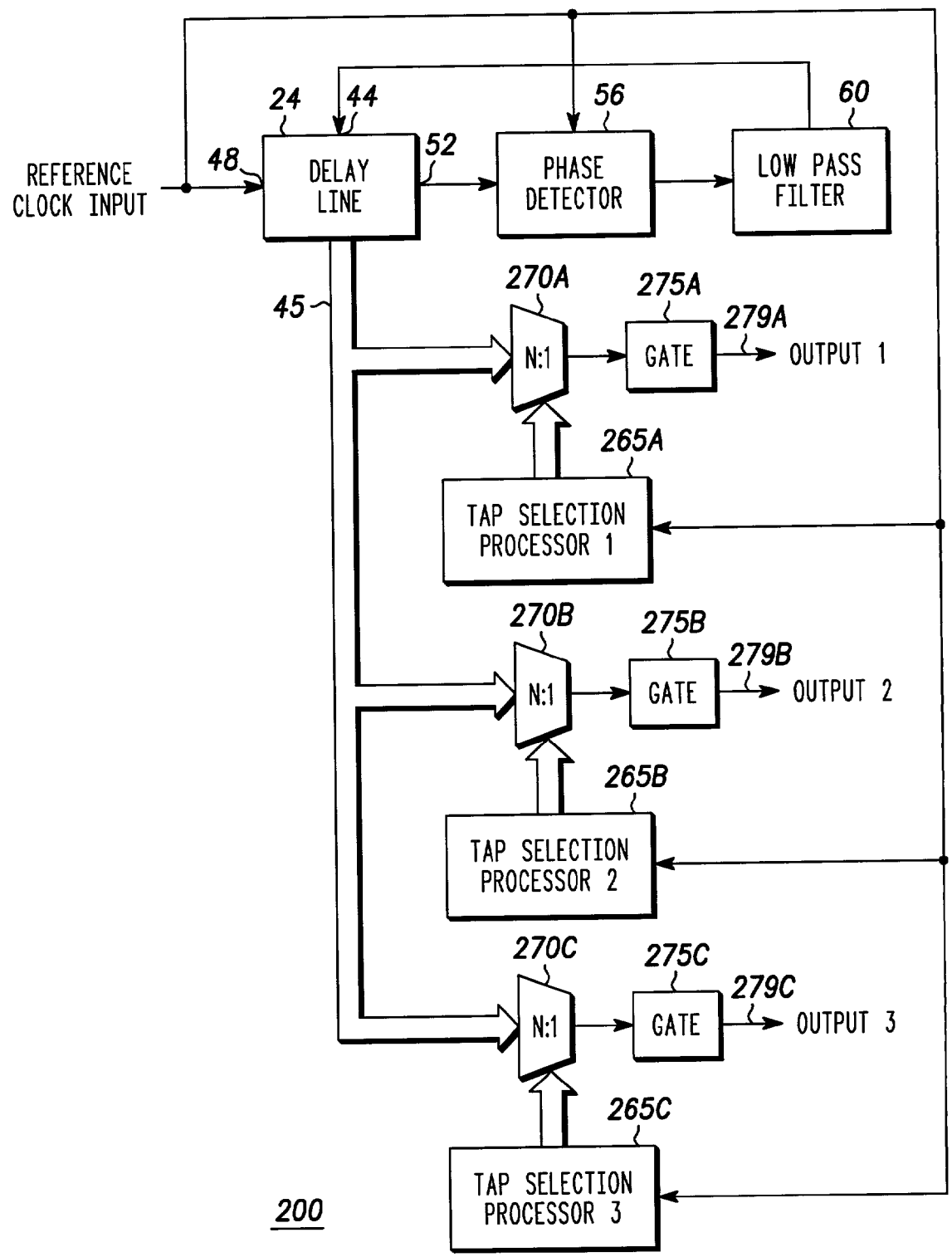
FIG. 4 is a block diagram of a delay locked loop structure having multiple output capability, consistent with an embodiment of the present invention.

FIG. 4 illustrates one technique, consistent with an embodiment of the present invention, of synthesizing multiple frequencies (in this example three frequencies are synthesized simultaneously) while reducing the current drain when compared with that of three separate synthesizers. In this example, the first output signal 279A (output 1) is synthesized in the same manner as that of output 79 of FIG. 1 using a delay locked loop having delay line 44, phase detector 56 and filter 60. The output 1 signal 279A is selected by tap selection processor 265A causing N:1 multiplexer 270A to appropriately select a tap from delay line taps 45 at an appropriate time and by gating the multiplexer 270A's output through gate 275A.

In order to generate the remaining output signals, the same delay locked loop structure is shared with the delay line 44's tap outputs 45 being provided to a second and third arrangement for selection of the taps. Output 2 signal 279B is selected by tap selection processor 265B causing N:1 multiplexer 270B to appropriately select a tap from delay line taps 45 at an appropriate time and by gating the multiplexer 270B's output through gate 275B. Similarly, output 3 signal 279C is selected by tap selection processor 265C causing N:1 multiplexer 270C to appropriately select a tap from delay line taps 45 at an appropriate time and by gating the multiplexer 270C's output through gate 275C.

Thus, any collection of three output frequencies can be generated using the arrangement of FIG. 4. Of course, the present invention is in no way limited to systems to produce three outputs. In general, two or more output selection circuits can be used as in the circuit arrangement 200 to provide any desired number of output frequencies. Using CMOS or other high input impedance multiplexers, loading on the delay line is generally insignificant. However, driver circuitry can be used to boost the drive capacity of the delay line taps if necessary, with any delays introduced by the drivers appropriately accounted for.

The circuit arrangement of FIG. 4 can also be used to expand the number of output frequencies of a DLL frequency synthesizer such as that described in the above-referenced patent application entitled "Delay Locked Loop Circuit". In this application, a primary delay line is used to drive any of several arrangements of active or passive secondary delay lines to increase the frequency resolution of the synthesizer. Any circuit arrangement where a sequence of delay line taps are available in a DLL structure to provide incremental delay times at the taps can be used in conjunction with the present invention, where the delay line 44 of circuit 200 represents any of the multiple delay line arrangements disclosed in this patent application or other such arrangements, without limitation.

Circuit 200 illustrates three tap selection processors 265A, 265B and 265C that apparently independently produce tap addresses to cause multiplexers 270A, 270B and 270C to select tap outputs 45 from delay line 44. However, those skilled in the art will recognize that a single tap selection processor that by various means produces multiple tap addresses for the various multiplexers is entirely equivalent. Thus, the illustration of multiple or single tap selection processors is simply a matter of convenience in illustration for any particular embodiment and should not be considered to be a limitation.

By use of the above structure of circuit 200, for example, substantial current drain savings can be achieved over use of three separate DLL circuits. In a prototype constructed with commercially available hardware, the delay line 44, phase detector 56 and low pass filter 60 consume approximately 4.0 mW and the overall DLL circuit 20 consumes approximately 7.1 mW. The tap selection circuitry alone, therefore consumes approximately 3.1 mW. Thus, if frequency synthesis of three frequencies were accomplished using three DLLs such as 20, approximately 3×7.1 mW=21.3 mW of power would be consumed. However, the circuit 200 sharing a single loop and using three tap selection circuit arrangements would consume only 4.0 mW+(3×3.1 mW)=13.3 mW. In this example, a 62.4% savings in power consumption is achieved.

The above circuit arrangement 200 can be used to synthesize any desired set of frequencies (to within the accuracy of the DLL). The output frequencies can be related or unrelated as desired. In general, the first tap selection circuit produces a first set of tap addresses to select a first set of the plurality of tap outputs from the delay line according to a first timing to produce a first output signal. A second tap selection circuit produces a second set of tap addresses to select a second set of the plurality of tap outputs from the same delay line according to a second timing to produce a second output signal, which may be related or unrelated to the first output signal. The first tap selection processor selects the first set of the plurality of tap outputs from the delay line according to the first timing. A first demultiplexer is responsive to the first tap selection processor to selectively route the selected first set of tap outputs to a common node to produce the first output signal. Similarly, the second tap selection processor selects the second set of the plurality of tap outputs from the delay line according to the second timing. A second demultiplexer is responsive to the second tap selection processor to selectively route the selected second set of tap outputs to a common node to produce the second output signal.

Figure 5:
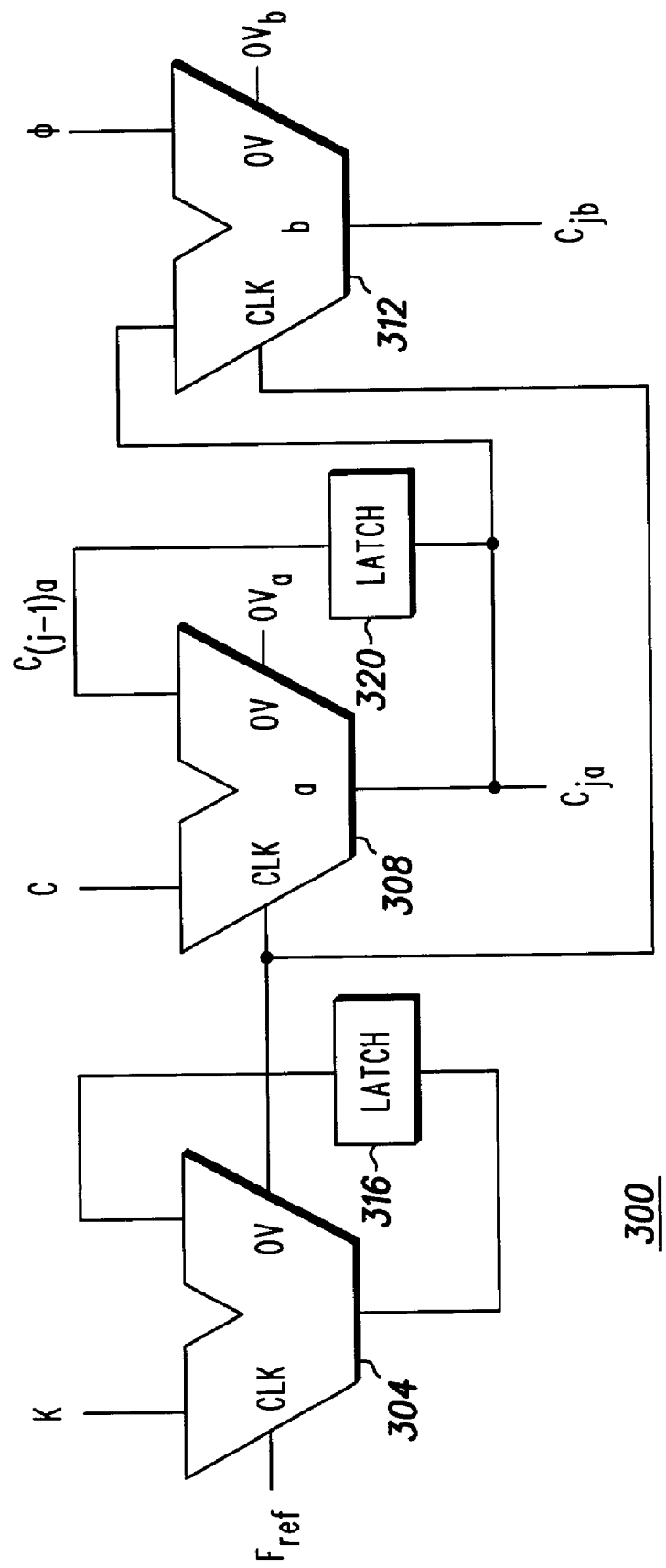
FIG. 5 is a block diagram of a circuit used to produce a fixed or variable phase shift between two output signals consistent with an embodiment of the present invention.

When predetermined output frequencies are required to have a predetermined phase relationship to one another, other circuit arrangements can also be used to synthesize the output frequencies, and further simplification of the circuitry can be achieved. FIG. 5 illustrates one embodiment of such a circuit arrangement 300 in which the phase relationship of the two output signals are related by a phase shift α in radians. In this embodiment, the output signals are synthesized under the control of two sets of tap coefficients $C_{ja}$ and $C_{jb}$ which are related as follows:

$$C_{ja}=C_{(j-1)a}+C$$

$$C_{jb}=C_{(j-1)a}+C+\Phi$$

Where:

$\Phi$ is the phase shift expressed as a fraction of wavelength=$\alpha/(2\pi)$, α is the desired phase shift in radians, $C_{ja}$ is the $j^{th}$ tap in a tap sequence used to produce an output $F_{outa}$, $C_{jb}$ is the $j^{th}$ tap in a tap sequence used to produce an output $F_{outb}$, and C is the fractional part of K.C of Equation 1.

In the circuit 300 illustrated in FIG. 5, three adders 304, 308 and 312 are configured to produce any desired pair of output signals with a common frequency and a phase difference of $\Phi=\alpha/(2\pi)$. The algorithms of FIGS. 2 and 3 can be implemented using this circuit omitting adder 312 to produce tap coefficient addresses $C_j$ (shown as $C_{ja}$). Adder 304 receives the reference clock signal $F_{ref}$ as a clock (clk) input thereto and receives the integer portion K of ratio K.C at the adder input. Adder 304 is configured as an accumulator (a frequency accumulator) by virtue of it's output being fed back through latch 316 to the second input thereof. The overflow output (ov) of adder 304 drives the clock input of adder 308, so that the adder 308 is clocked every time the accumulator made up of adder 304 and latch 316 overflows. This overflow output (ov) of adder 304 also drives the clock input (clk) of adder 312 so that adder 312 is similarly clocked every time the accumulator of adder 304 and latch 316 overflows.

Adder 308 is also configured as an accumulator (a phase accumulator) by having the output thereof fed back through a latch 320 to an input thereof. The other input of adder 308 receives the value C as an input. The output of adder 308 produces the values of $C_{ja}$ that are used in producing $F_{outa}$. The values $C_{ja}$ are supplied as an input to adder 312. The value of $\Phi$ is supplied as the second input to adder 312 so that the output of adder 312 produces the coefficients $C_{jb}$ used to produce the output signal $F_{outb}$. Where $\Phi$ is normalized by the ratio of $F_{ref}/F_{out}$. For the 375 MHz example, an α of π/2 radians phase offset would result in a $\Phi$ equal to K.C×α/(2π) or 0.3.

In the example just given, phase offset from a reference signal is accomplished with a value summed with the output of the reference signal phase accumulator. This can be a positive or negative value between −K.C and +K.C which corresponds to −2π and 2π at the output signal $F_{out}$. In the example shown, a quadrature set of signals have two signals in phase and quadrature with a 90 degree (π/2 radians or $\Phi$=0.25=(π/2)/(2π)) phase offset for the quadrature signal. With the additional summer the quadrature signal could have a compensation value other then the expected 0.25 for $\Phi$. This provides compensation for any phase imbalance within the signal processing associated with the signal source such as a receiver or transmitter modulator.

Thus, the simple circuit arrangement 300 of two accumulators and an adder can be configured as the tap selection processor 300 used to provide any two signals having a specified phase relationship with one another with the phase difference specified as a fraction of K.C, $\Phi$. This is accomplished as illustrated using a tap selection circuit that selects a first sequence of tap addresses $C_{ja}$ and an adder that adds a phase shift component $\Phi$ to the first sequence of tap addresses $C_{ja}$ to produce a second sequence of tap addresses $C_{jb}$. The first sequence of tap addresses $C_{ja}$ are applied to a first multiplexer to produce a first output signal $F_{outa}$, and the second sequence of tap addresses $C_{jb}$ are applied to a second multiplexer to produce a second output signal $F_{outb}$, wherein $F_{outa}$ differs from $F_{outb}$ by a phase shift related to $\Phi$. In one specific non-limiting example, two quadrature signals (having a phase difference of 90 degrees) can be produced using circuit 300 with the fractional phase difference $\Phi = \pm 0.25 \times K.C$.

Figure 6:
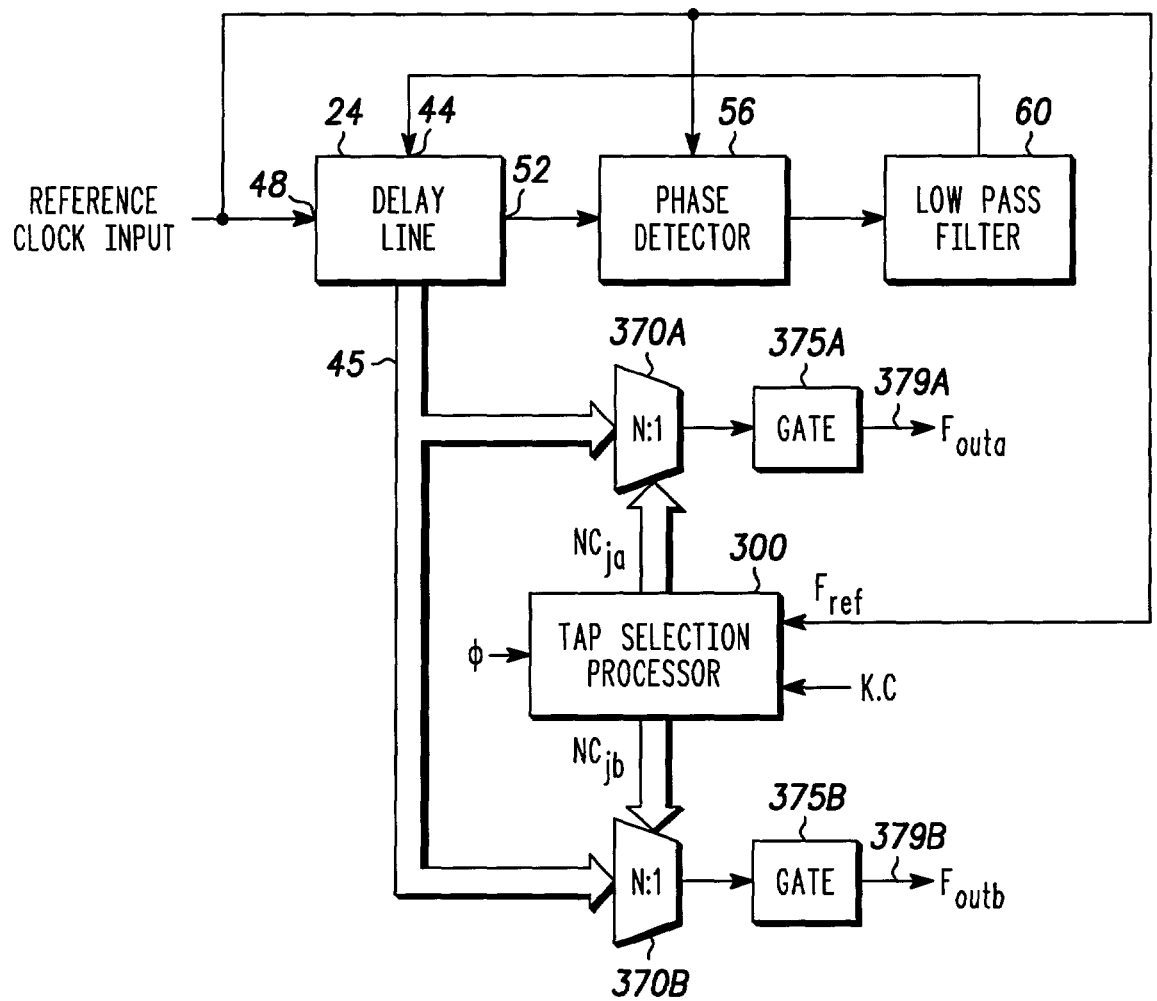
FIG. 6 is a block diagram illustrating the use of the tap selection processor of FIG. 5 to produce two signals related in phase consistent with an embodiment of the present invention.

FIG. 6 illustrates use of tap selection processor 300 with the delay locked loop arrangement illustrated as frequency synthesizer 400. In this embodiment, a single tap selection processor circuit 300, as in FIG. 5, is used to generate coefficients $C_{ja}$ and $C_{jb}$ to produce output signals $F_{outa}$ and $F_{outb}$. The tap outputs 45 from delay line 24 are supplied to a pair of multiplexers 370A and 370B simultaneously. The taps are selected in tap selection processor circuit 300 as previously described to produce coefficients $C_{ja}$ which are supplied to multiplexer 370A and coefficients $C_{jb}$ which are supplied to multiplexer 370B. The tap selection processor 300 receives as inputs the reference clock signal $F_{ref}$, the phase offset $\Phi$ (which may be a constant, selectable, variable or even a time varying value) and the value of K.C (e.g., from a microcontroller).

The output of multiplexer 370A is gated by a gate 375A to produce an output $F_{outa}$ at output 379A. Similarly, the output of multiplexer 370B is gated by a gate 375B to produce an output $F_{outb}$ at output 379B. So, for example, if quadrature outputs are desired, $\Phi = 0.25 \times K.C$ is applied to the tap selection processor 300 and output 379B will be produced at a constant phase shift of 90 degrees from the output 279A.

Figure 7:
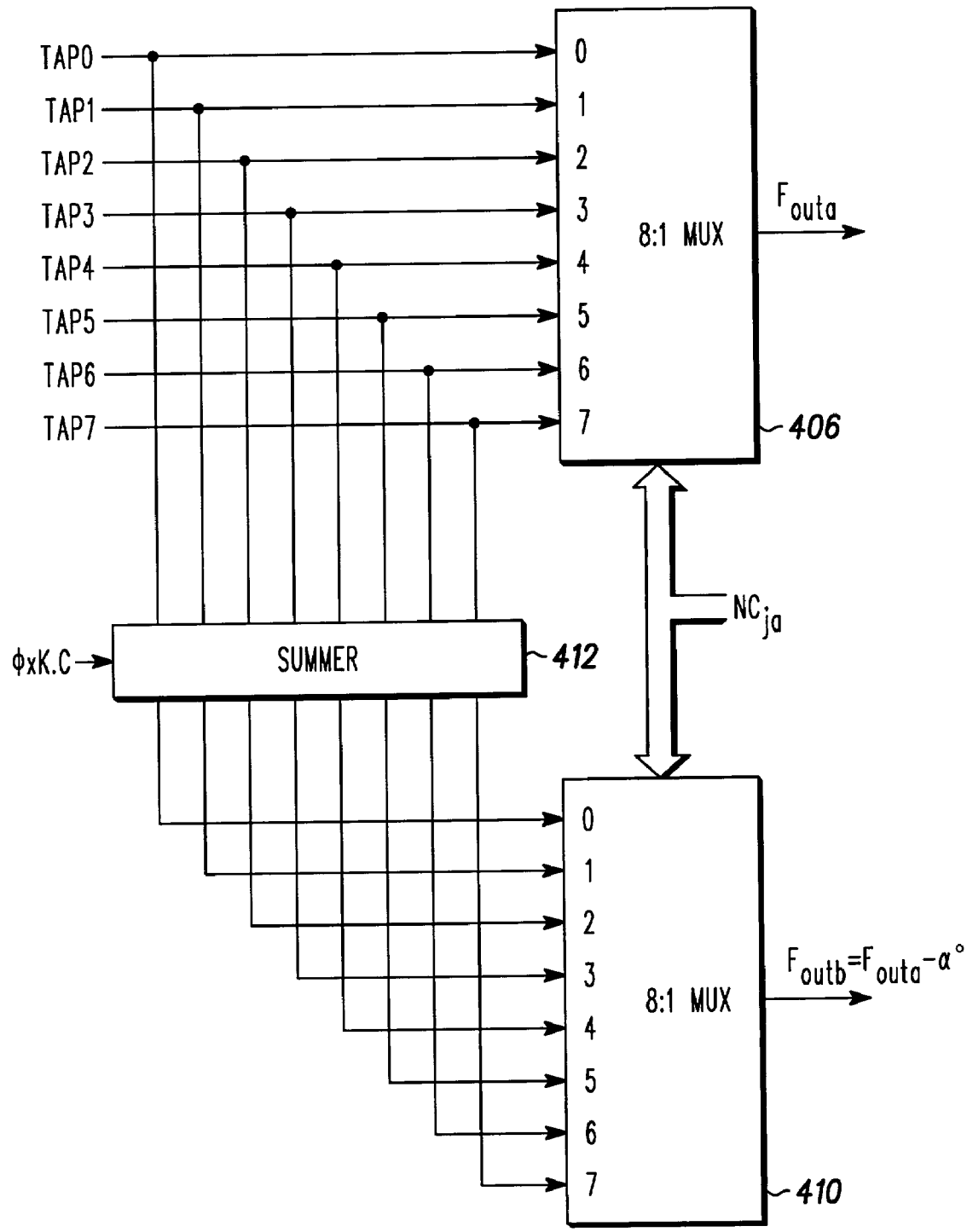
FIG. 7 is another block diagram illustrating use of two exemplary multiplexers and a delay element wired to produce a fixed out of phase output consistent with another embodiment of the present invention.

In the embodiment of FIG. 7, a delay element 412 is imposed between the tap ouputs and the multiplexer 410's tap inputs. This equivalently causes the single set of tap addresses $C_{ja}$ to address two different sets of taps in the two multiplexers 406 and 410 to produce two output signals differing in phase. As illustrated, a shift of 0.25×K.C is illustrated, but this should not be limiting since the any fixed or even variable (e.g., time varying) phase shift can be imposed without departing from the invention.

Of course, the examples given in FIG. 7 using a simple eight tap embodiment can be extended to a system using any number of taps by simply scaling the input. Similarly, the phase shift of 90 degrees used in these examples can be any suitable phase shift by simply normalizing the desired phase shift and delaying accordingly, without limitation. In the example of FIG. 7, the delay elements 412 can also be made variable as desired to program any suitable desired phase shift. Moreover, the delays can be implemented as separate fixed or variable delays or by using additional delay elements in a pair of delay lines without limitations.

Modulation (be it phase, amplitude, frequency or some combination thereof) can be applied to a digital to phase synthesizer by way of a number of methods, including modulation of the reference input, summing an offset signal with the delay line tuning signal, modulating the k and or C control words, and modifying the Cj tap selection word. The most direct method of applying phase modulation to the output signal is to sum a digital word with the Cj value. The modulated value would be a digital word representing the normalized phase offset modulation or the desired phase shift in radians divided by $2\pi$. This can be a positive or negative offset by as much as $2\pi$. In general, this can be achieved in a delay locked loop having delay line with a plurality of tap outputs using a tap selection processor that selects a sequence of time varying tap addresses C(t) that vary in accordance with a modulating signal m(t).

Figure 8:
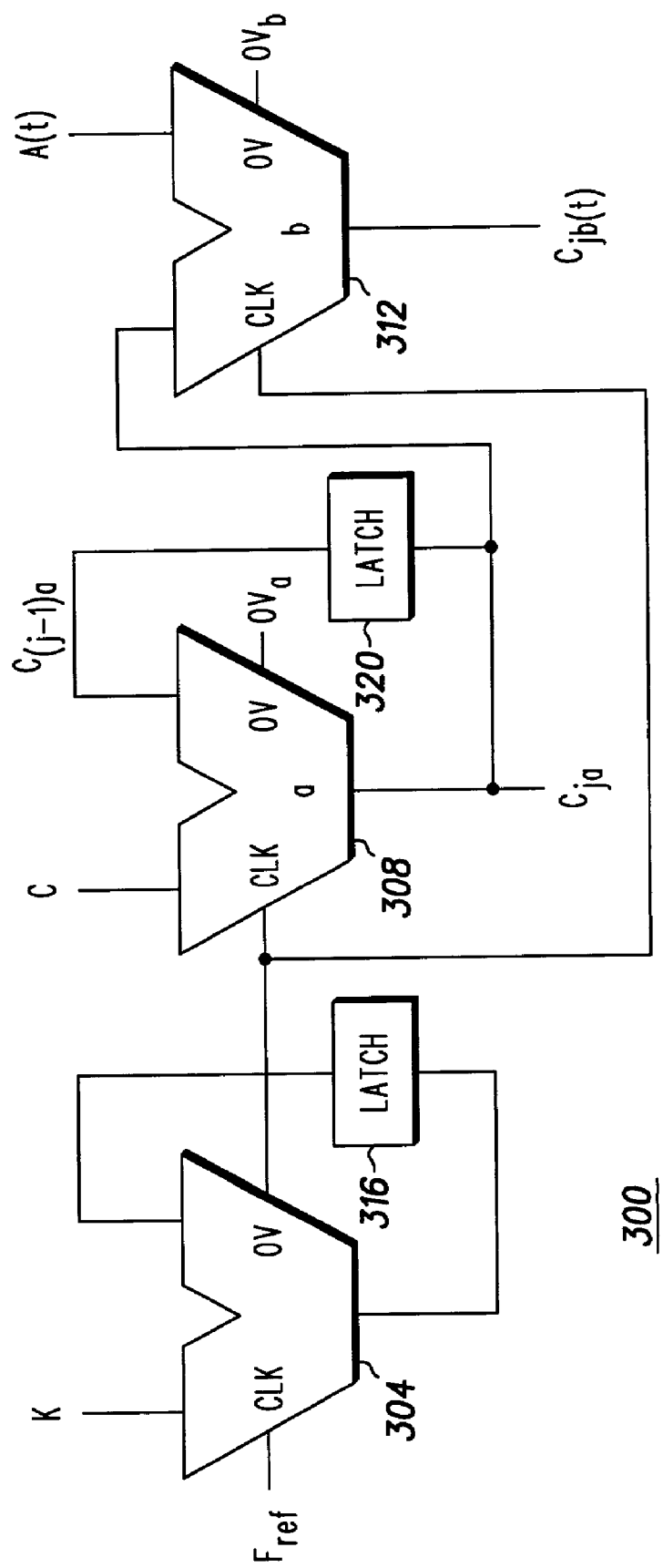
FIG. 8 is an exemplary digital phase modulator consistent with an embodiment of the present invention.

The circuit structure of FIG. 5 can be used as a digital phase modulator in this manner as illustrated in FIG. 8. The fixed input signal $\Phi$ of FIG. 5 is replaced in FIG. 8 by a time varying modulating signal A(t), where:

A(t)=normalized phase modulating signal

A(t)=phase modulating signal×K.C/($2\pi$).

Thus:

$$C_{ja} = C_{(j-1)a} + C$$

$$C_{jb} = C_{ja} + A(t)$$

If the harmonic content of the resulting output signal is ignored (or removed, e.g., by filtering), the output signal at output $F_{outb}$ is given by:

$$F_{outb}(t) = x \, e^{-j[\omega t + 2\pi A(t)]}$$

Where x is an amplitude constant. Thus, phase modulation can be introduced using the circuit of FIG. 8.

Thus, a digital phase modulator can be provided using a delay locked loop having delay line with a plurality of tap outputs. A tap selection processor selects a sequence of time varying tap addresses $C_j(t)$ that vary in time in accordance with a modulating signal m(t). The time varying tap addresses $C_j(t)$ are applied to a multiplexer circuit to select a time varying sequence of tap outputs as a phase modulated output signal $F_{out}(t)$. In one embodiment, the tap selection processor uses an adder that adds the modulating signal m(t) to a selected sequence of tap addresses $C_j$ to produce $C_j(t)$.

By applying a time varying signal A(t) as an input to the summer 312, the values of the $C_{jb}(t)$ coefficients are time varying and modulated according to the time varying nature of A(t). These time varying coefficients $C_{jb}(t)$ are then used to select taps using a multiplexer as previously described. This produces a time varying phase shift of the output signal $F_{outb}(t)$ with the phase of $F_{outb}(t)$ varying in accordance with A(t) to produce digital phase modulation.

Figure 9:
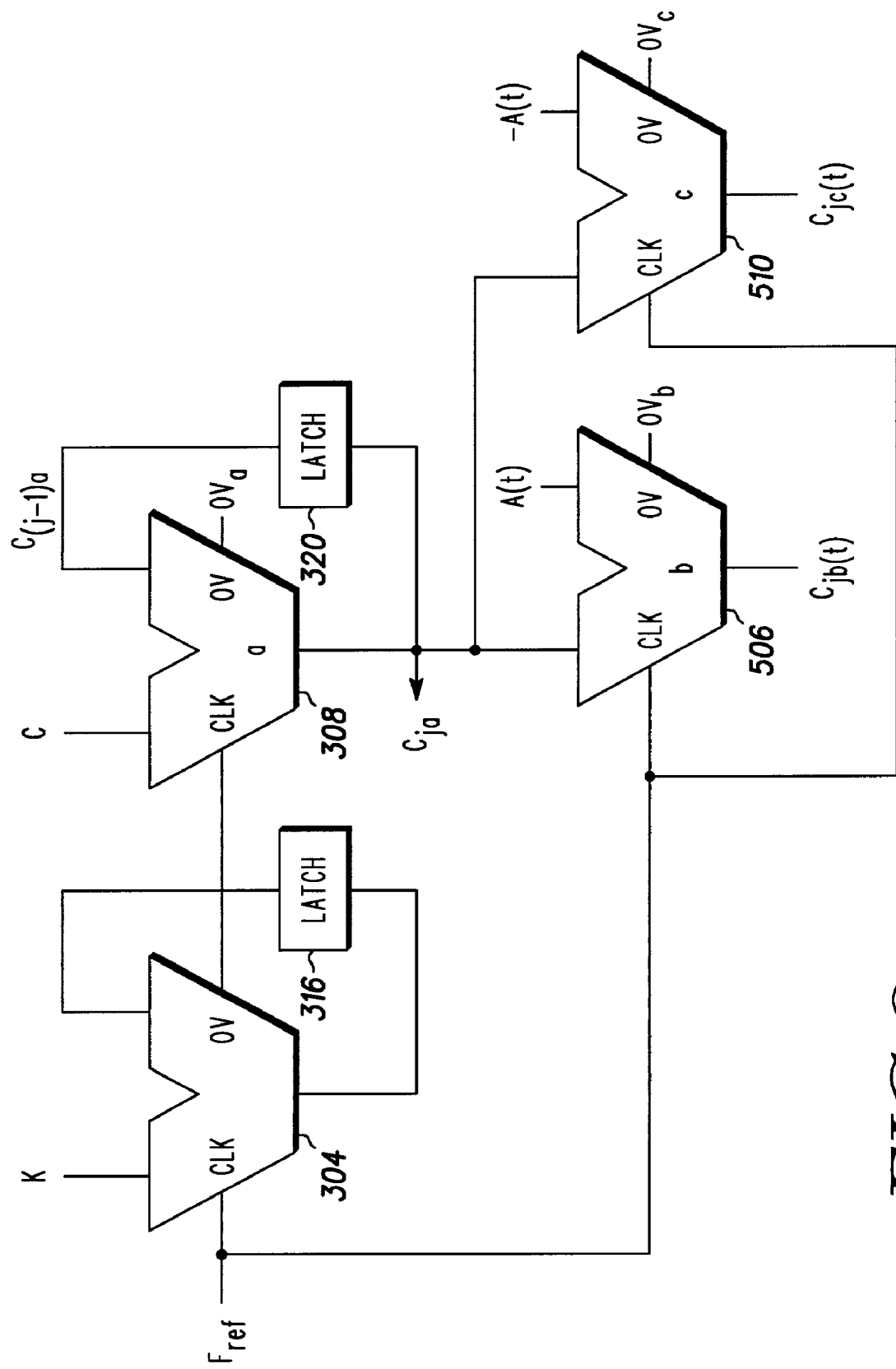
FIG. 9 illustrates a first portion of an exemplary digital amplitude modulator consistent with an embodiment of the present invention.
Figure 10:
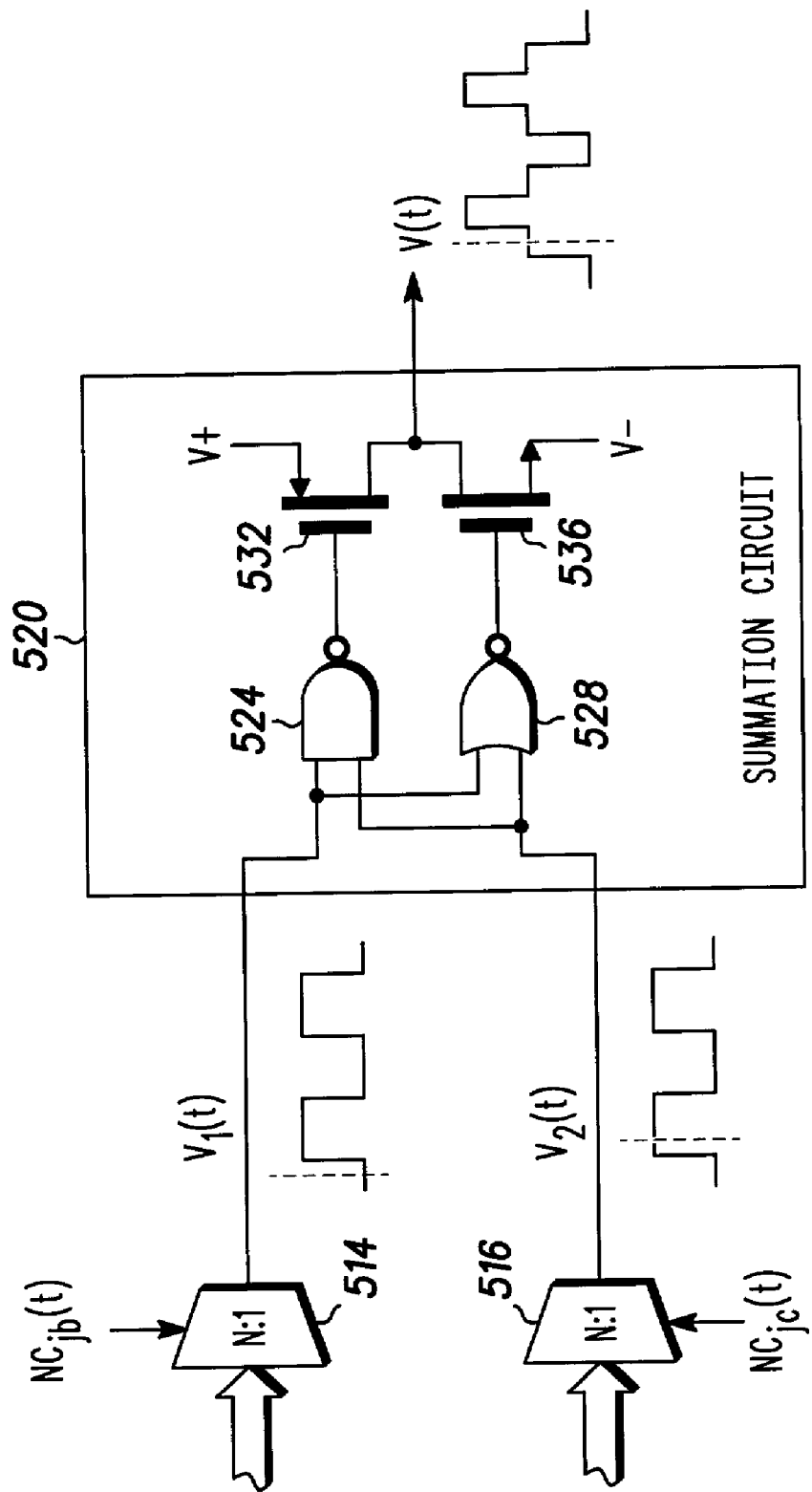
FIG. 10 illustrates a second portion of an exemplary digital amplitude modulator consistent with an embodiment of the present invention including a summation circuit.

Digital amplitude modulation can also be produced using digital techniques in conjunction with a delay locked loop in a manner consistent with embodiments of the present invention. One technique for accomplishing this is illustrated in FIG. 9 and FIG. 10. In FIG. 9, the accumulator made of adder 304 and latch 316 operates as a frequency accumulator as described in connection with FIG. 5. Similarly, the accumulator made of adder 308 and latch 320 operates as a phase accumulator. The output $C_{ja}$ of adder 308 is provided to two adders 506 and 510. The second input of adders 506 and 510 are driven by a modulating signal A(t) and an out of phase modulating signal −A(t), respectively. A(t) may be any suitable time varying modulating signal. The outputs of adders 506 and 510 are two sets of time varying tap addresses $C_{jb}(t)$ and $C_{jc}(t)$ used to address a pair of multiplexers 514 and 516, respectively, to produce a pair of time varying signals shown as $V_1(t)$ and $V_2(t)$. Since the signals $V_1(t)$ and $V_2(t)$ are produced from time varying signals A(t) and −A(t), they are also time varying. Again, if one ignores (or removes) the harmonic content of these signals $V_1(t)$ and $V_2(t)$, their fundamental frequency can be represented as:

$$V_1(t) = x \, e^{-j[\omega t + 2\pi A(t)]}$$

and $$V_2(t) = x \, e^{-j[\omega t - 2\pi A(t)]}$$

Where x is again a constant.

These two signals are added together in a summation circuit such as 520 to produce an output signal V(t). Again ignoring the harmonic content, V(t) can be represented as:

$$V(t) = V_1(t) + V_2(t) = x \, e^{-j[\omega t + 2\pi A(t)]} + x \, e^{-j[\omega t + 2\pi A(t)]}$$

$$V(t) = 2x \, \text{Cos}\,[2\pi A(t)] e^{-j\omega t}$$

Thus, in order to produce an amplitude modulated signal, the arrangement of FIGS. 9 and 10 can be used. Note, however, that the modulating signal A(t) is represented in the argument of the Cosine function in the output. Thus, to produce a desired amplitude modulated output, an inverse cosine operation can be performed on a modulating signal to produce A(t). Therefore, if the desired modulating signal is represented as B(t), to produce an output given by:

$$V(t)=B(t)e^{-j\omega t}$$

then A(t) is defined by:

$$B(t)=2x\,Cos\,[2\pi A(t)]$$

$$B(t)/2x=Cos\,[2\pi A(t)]$$

$$Cos^{-1}[B(t)/2x]=2\pi A(t)$$

and $$A(t)=(1/2\pi)Cos^{-1}[B(t)/2x].$$

In the amplitude modulator of FIG. 9 and FIG. 10, phase modulation can be readily introduced simultaneously by use of a phase offset summer at the output of adder 308, after the latch input and prior to the inputs of adders 506 and 510. (Alternatively, a phase component of the modulating signal A(t) can be introduced, either using a phase adder or as a part of one of the A(t) signals input to adders 506 or 510.) In this example, if $C_{ja}$ has a phase offset component such that an output signal produced therefrom would be represented as:

$$V_{cja}=Xe^{-[j\omega t+\theta(t)]}$$

Then, $$V(t)=V_1(t)+V_2(t)=x\,e^{-[j\omega t+2\pi A(t)+\theta(t)]}+x\,e^{-[j\omega t-2\pi A(t)-\theta(t)]}$$

$$V(t)=2x\,Cos\,[2\pi A(t)]e^{-[j\omega t+\theta(t)]}$$

Thus introducing both amplitude and phase modulation.

A digital amplitude modulator consistent with the above structure can have a delay locked loop having delay line with a plurality of tap outputs. A tap selection processor selects a sequence of time varying tap addresses $C_j(t)$ that vary in time in accordance with a modulating signal m(t). The time varying tap addresses $C_j(t)$ are applied to a multiplexer circuit to select a time varying sequence of tap outputs as an amplitude modulated output signal $F_{out}(t)$.

Referring back to FIG. 10, summation circuit 520 can be realized in any number of ways. The circuitry shown provides a three state summation function that is easily implemented and provides a three level analog summing function. The signals $V_1(t)$ and $V_2(t)$ are simultaneously supplied to the inputs of a NAND gate 524 and NOR gate 528. Their outputs drive the gates of a pair of transistors 532 and 536 respectively that are tied in series between a positive and negative supply (or positive and ground, etc.). The output V(t) is obtained at the junction of the two transistors to produce the summation output. TABLE 4 below is a truth table of the output signal provided from this circuit.

TABLE 4

| $V_1$ | $V_2$ | $V_3$ |
|---|---|---|
| 0 | 0 | 0 |
| 0 | 1 | ½ (float) |
| 1 | 0 | ½ (float) |
| 1 | 1 | 1 |

As illustrated, the summation produces three possible output levels, positive supply, negative supply and a point in between. Since the output signal is tied essentially at the positive and negative supplies or a floating point in the middle, there is no introduction of noise from the input at these levels and good signal to noise ratio can be produced if the transitions occur quickly and are small in time compared to the time the output signal is at one of the three defined states.

Figure 11:
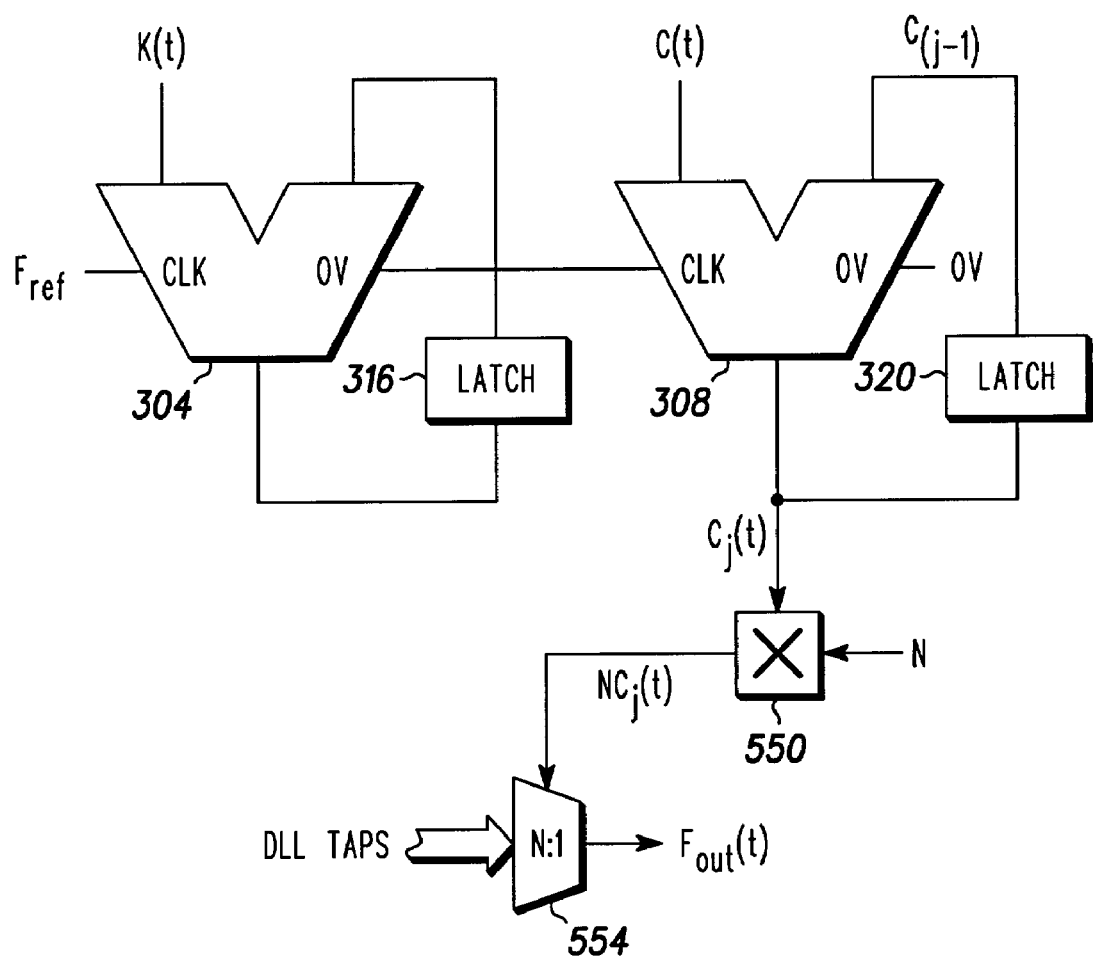
FIG. 11 illustrates a first example of a digital frequency modulator consistent with an embodiment of the present invention.

Frequency modulation (direct proportionality between the modulating signal and the derivative of the phase deviation), can be implemented with the instantaneous frequency being processed onto the K and C digital input words as illustrated in FIG. 11. In this example, K and C are expressed as functions of time K(t) and C(t) which are applied as inputs to adders 304 and 308. The output coefficients $C_j(t)$ are also a function of time and are multiplied by N at multiplier 550 and used to address a multiplexer 554 to produce $F_{out}$. The input information signal m(t) is defined in terms of a frequency offset from the desired carrier $F_{out}$ and processed as a ratio with the input reference signal $F_{ref}$. That is:

$$2\pi(F_{out}-F_{mod})=K\,m(t)=d(f(t))/dt$$

The modulation signal processing is a function of the operating frequency and not the desired operation independent of the operating frequency. Although this implementation is clearly possible, it may not be the most practical implementation with the best utilization of power and circuit resources.

Figure 12:
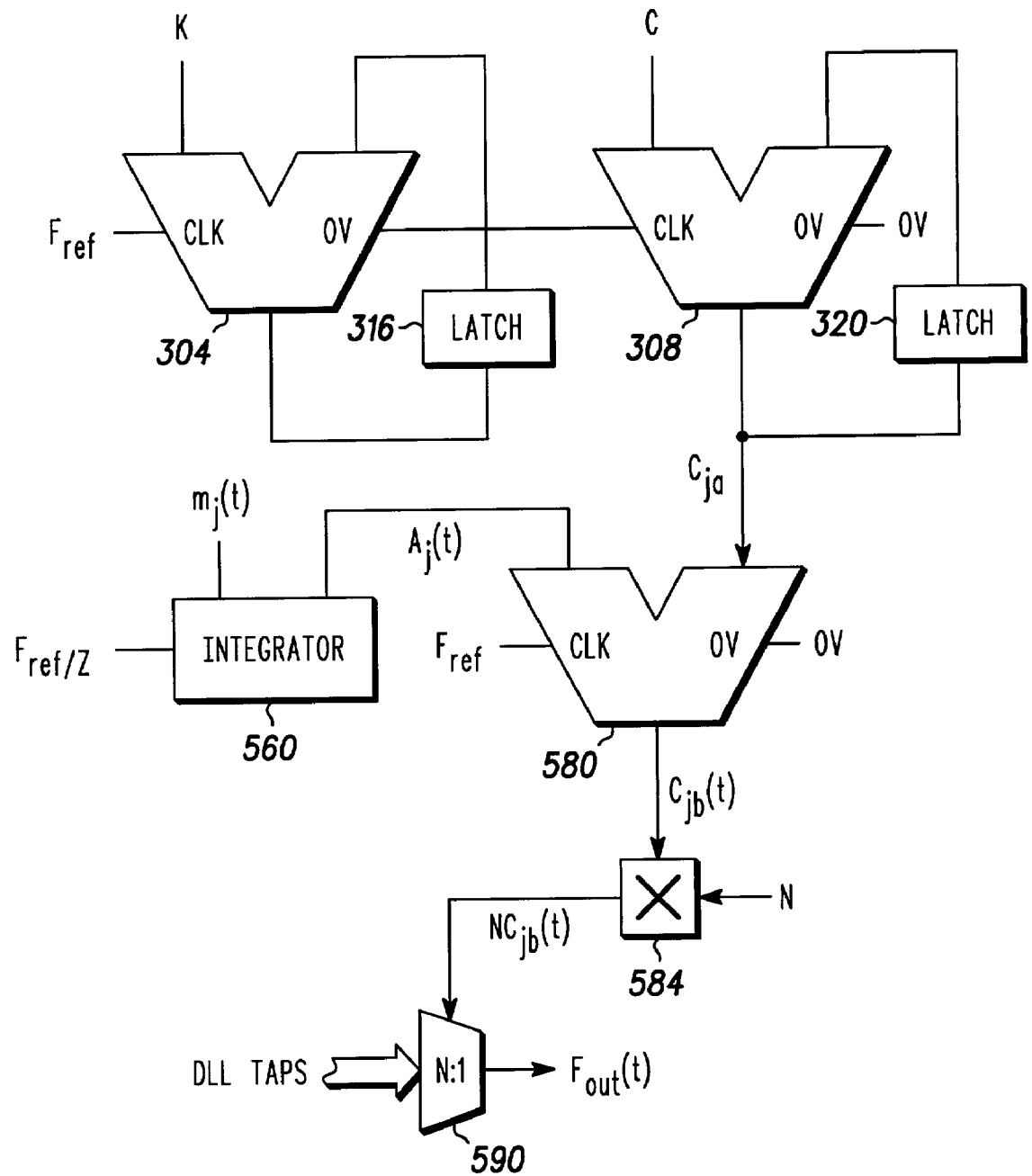
FIG. 12 illustrates a second example of a digital frequency modulator consistent with an embodiment of the present invention.

FIG. 12 illustrates a more direct implementation of frequency modulation where the modulating signal m(t) is processed by an integrator 560 operating at a rate of $F_{ref}/Z$ where Z is the sampling rate for the modulating signal.

This integrated output signal, shown as $A_j(t)$ is added to $C_{ja}$ in an adder 580 to produce a set of time varying tap addresses Cjb(t) which, after multiplication by N in multiplier 584, are used to select the appropriate taps in the N:1 multiplexer 590 to produce a frequency modulated output signal $F_{out}(t)$.

Thus, in certain embodiments, digital frequency modulation can be achieved in a digital frequency modulator circuit having a delay locked loop having delay line with a plurality of tap outputs. A tap selection processor that selects a sequence of time varying tap addresses $C_j(t)$ that vary in time in accordance with a modulating signal m(t). The time varying tap addresses $C_j(t)$ are applied to a multiplexer circuit to select a time varying sequence of tap outputs as a frequency modulated output signal $F_{out}(t)$. In one embodiment, the tap selection processor has an integrator that integrates the modulating signal m(t) and an adder that adds the integrated modulating signal m(t) to a selected sequence of tap addresses $C_j$ to produce $C_j(t)$.

Thus, the tap values from a tap selection processor can be selected to produce a time varying tap output value that produces frequency or phase modulation, multiple time varying tap output values which can be summed to produce amplitude modulation, or any combination of frequency, phase and amplitude modulation as desired. The examples illustrated provide several examples of circuit arrangements to accomplish such modulation, but the present invention should not be limited to these specific embodiments, since many other configurations can be used in a tap selection processor arrangement to produce time varying tap selection to effect modulation.

A digital modulator consistent with these embodiments of the invention has a delay locked loop having delay line with a plurality of tap outputs and a tap selection processor that selects a sequence of time varying tap addresses C(t). In general, the time varying tap addresses C(t) are applied to a multiplexer circuit to select a time varying sequence of tap outputs as an output signal $F_{out}(t)$. The time varying tap addresses C(t) are selected to amplitude modulate, phase modulate or frequency modulate the output signal $F_{out}(t)$. In certain embodiments, the techniques can be combined to produce any desired combination of amplitude, phase and frequency modulation.

Figure 13:
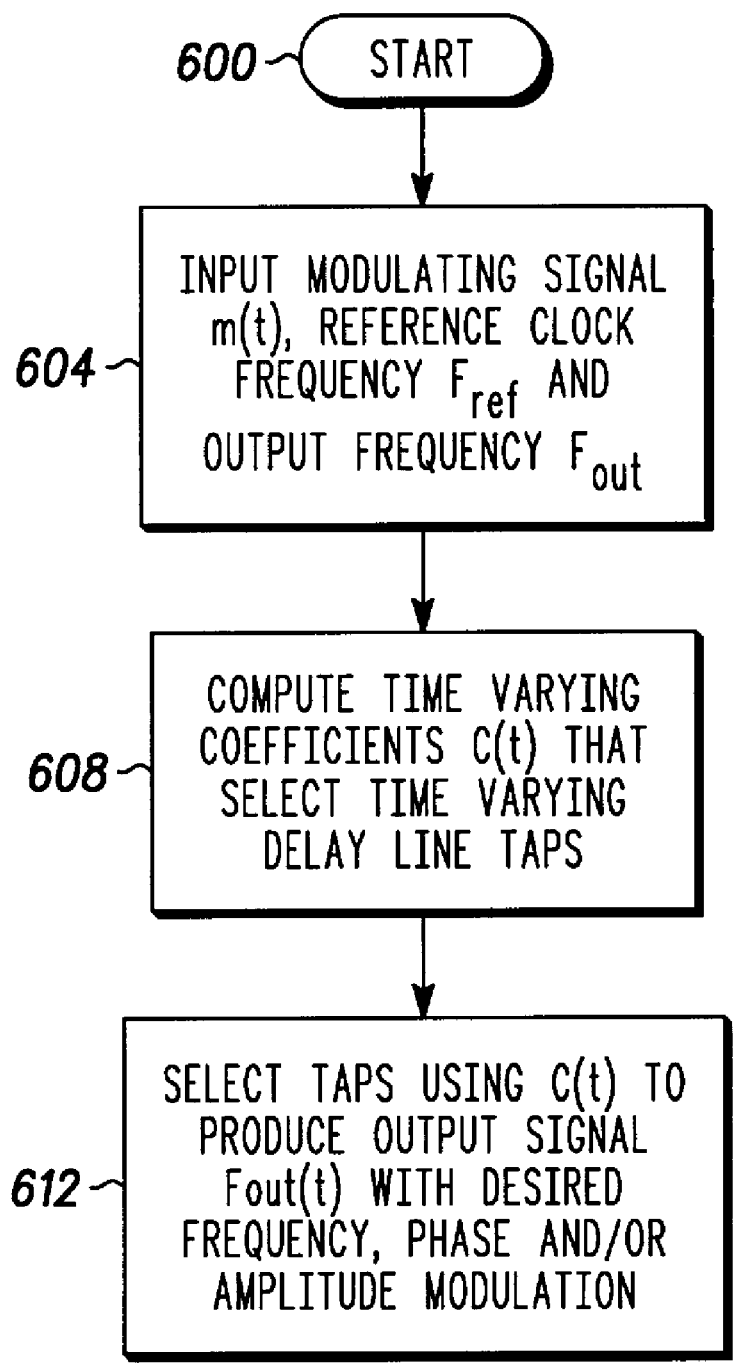
FIG. 13 is a high level flow chart explaining a technique consistent with certain embodiments of the present invention for producing digital modulation.

FIG. 13 provides an overall description of a high level process consistent with certain embodiments of the present invention for producing digital modulation. The process starts at 600 after which an input modulating signal m(t), a reference clock signal $F_{ref}$ and an output frequency $F_{out}$ are provided as inputs at 604. A set of time varying coefficients (tap addresses) C(t) are computed at 608 to select delay line taps in a time varying manner. These taps are selected at 612 to produce amplitude, phase or frequency modulation or any combination thereof as desired. This can be accomplished using the hardware embodiments described or other hardware or software based embodiments, so long as an appropriate sequence of time varying tap addresses are selected to produce the desired modulation.

The present invention, as described in embodiments herein, is implemented using hardware devices (i.e., delay lines, phase detectors, etc.), however, those of ordinary skill in the art will appreciate that the invention could equivalently, in certain embodiments, be implemented in whole or in part using a programmed processor executing programming instructions. Such program instructions can be stored on any suitable electronic storage medium or transmitted over any suitable electronic communication medium.

Those skilled in the art will recognize that certain embodiments of the present invention has been described in terms of exemplary embodiments that may be based upon use of hard wired circuitry. However, the invention should not be so limited, since the present invention could be implemented using a programmed processor performing equivalent functions such as dedicated or general purpose processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

The present invention, as described in embodiments herein, may be implemented using a programmed processor executing programming instructions that are broadly described above, sometimes in flow chart form, that can be stored on any suitable electronic storage medium or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A circuit, comprising:
a delay locked loop having a delay line with a plurality of tap outputs;
a first tap selection circuit that produces a first set of tap addresses to select a first set of the plurality of tap outputs from the delay line according to a first timing to produce a first output signal;
a second tap selection circuit that produces a second set of tap addresses to select a second set of the plurality of tap outputs from the delay line according to a second timing to produce a second output signal;
a modulator combining the first and second output signals to produce a modulated output signal; and
wherein the modulator frequency-modulates the first output signal with the second output signal.

2. A circuit, comprising:
a delay locked loop having a delay line with a plurality of tap outputs;
a first tap selection circuit that produces a first set of tap addresses to select a first set of the plurality of tap outputs from the delay line according to a first timing to produce a first output signal;
a second tap selection circuit that produces a second set of tap addresses to select a second set of the plurality of tap outputs from the delay line according to a second timing to produce a second output signal;
a modulator combining the first and second output signals to produce a modulated output signal; and
wherein the modulator phase-modulates the first output signal with the second output signal.

3. A circuit, comprising:
a delay locked loop having a delay line with a plurality of tap outputs;
a first tap selection circuit that produces a first set of tap addresses to select a first set of the plurality of tap outputs from the delay line according to a first timing to produce a first output signal;
a second tap selection circuit that produces a second set of tap addresses to select a second set of the plurality of tap outputs from the delay line according to a second timing to produce a second output signal;
a modulator combining the first and second output signals to produce a modulated output signal; and
wherein the modulator amplitude-modulates the first output signal with the second output signal.

4. A circuit, comprising:
a delay locked loop having a delay line with a plurality of tap outputs;
a first tap selection circuit that produces a first set of tap addresses to select a first set of the plurality of tap outputs from the delay line according to a first timing to produce a first output signal;
a second tap selection circuit that produces a second set of tap addresses to select a second set of the plurality of tap outputs from the delay line according to a second timing to produce a second output signal;
a tap selection processor that selects the first set of the plurality of tap outputs from the delay line according to the first timing, and selects the second set of the plurality of tap outputs from the delay line according to the second timing, the tap selection processor comprising:

a frequency accumulator receiving an integer part K of K.C where K.C=$F_{out}/F_{ref}$, where $F_{out}$ is a desired output frequency and $F_{ref}$ is a reference clock frequency, and wherein the frequency accumulator is clocked by $F_{ref}$; and a phase accumulator that receives the fractional part C of K.C, wherein the phase accumulator is clocked by an overflow of the frequency accumulator, and wherein the frequency accumulator produces the first set of the plurality of tap output addresses as an output thereof;

a first demultiplexer responsive to the tap selection processor to selectively route the selected first set of the plurality of tap outputs to a common node to produce the first output signal; and a second demultiplexer responsive to the tap selection processor to selectively route the selected second set of the plurality of selected tap outputs to another common node to produce the second output signal.

5. A circuit, comprising:
a delay locked loop having a delay line with a plurality of tap outputs;
a first tap selection circuit that produces a first set of tap addresses to select a first set of the plurality of tap outputs from the delay line according to a first timing to produce a first output signal, the first tap selection circuit further comprising:
a first tap selection processor that selects the first set of the plurality of tap outputs from the delay line according to the first timing; and
a first demultiplexer responsive to the first tap selection processor to selectively route the selected first set of tap outputs to a common node to produce the first output signal;
a second tap selection circuit that produces a second set of tap addresses to select a second set of the plurality of tap outputs from the delay line according to a second timing to produce a second output signal, the second tap selection circuit further comprising:
a second tap selection processor that selects the second set of the plurality of tap outputs from the delay line according to the second timing; and
a second demultiplexer responsive to the second tap selection processor to selectively route the selected second set of tap outputs to another common node to produce the second output signal;
and wherein the first tap selection processor comprises:
a frequency accumulator receiving an integer part K of K.C where K.C=$F_{out}/F_{ref}$, where $F_{out}$ is a desired output frequency and $F_{ref}$ is a reference clock frequency, and wherein the frequency accumulator is clocked by $F_{ref}$; and
a phase accumulator that receives the fractional part C of K.C, wherein the phase accumulator is clocked by an overflow of the frequency accumulator, and wherein the frequency accumulator produces the first set of the plurality of tap output addresses as an output thereof.

6. The apparatus according to claim 5, wherein the second tap selection processor comprises a phase offset adder receiving the first set of the plurality of tap outputs as a first input and a normalized phase shift as a second input thereto and producing the second set of the plurality of tap output addresses as an output thereof, and wherein the phase offset adder is clocked by the overflow of the frequency accumulator.

7. A circuit for producing two output signals having frequency $F_{out}$ and differing by a phase shift, comprising:

a delay locked loop having a plurality of addressable tap outputs;
a tap selection circuit that selects a first sequence of tap addresses $C_{ja}$ from the addressable tap outputs;
an adder that adds a normalized phase shift component $\Phi=\alpha/(2\pi)$ ($\alpha$=a desired phase shift in radians) to the first sequence of tap addresses $C_{ja}$ to produce a second sequence of tap addresses $C_{jb}$, where C is the fractional part of K.C in K.C=$F_{out}/F_{ref}$, and $F_{ref}$ being a reference clock frequency; and
a first multiplexer and a second multiplexer, wherein the first sequence of tap addresses $C_{ja}$ are applied to the first multiplexer to produce a first output signal $F_{outa}$, and wherein the second sequence of tap addresses $C_{jb}$ are applied to the second multiplexer to produce a second output signal $F_{outb}$, and wherein $F_{outa}$ differs from $F_{outb}$ by the desired phase shift.

8. The apparatus according to claim 7, wherein the desired phase shift comprises ±90 degrees.

9. The apparatus according to claim 7, wherein the desired phase shift component $\Phi$ comprises a time varying phase shift component.

10. A circuit for producing two output signals differing by a phase shift, comprising:
a delay locked loop having a plurality of addressable delay line tap outputs, the delay locked loop synthesizing the output signals at a frequency $F_{out}$, with K.C=$F_{out}/F_{ref}$, and $F_{ref}$ being a reference clock frequency;
a tap selection circuit that selects a sequence of tap addresses $C_{ja}$ from the plurality of addressable delay line tap outputs;
a first multiplexer, wherein the sequence of tap addresses $C_{ja}$ are applied to a plurality of inputs of the first multiplexer to produce a first output signal $F_{outa}$;
a second multiplexer, wherein the sequence of tap addresses $C_{ja}$ are added to a delay factor $\alpha/(2\pi)$ where $\alpha$ is a desired phase shift in radians and applied to a plurality of inputs of the second multiplexer to produce a second output signal $F_{outb}$; and
wherein the first and second multiplexers each comprise N:1 multiplexers having N inputs.

11. The apparatus according to claim 10, wherein $\alpha$ corresponds to a fixed phase shift.

12. The apparatus according to claim 10, wherein the $\alpha$ corresponds to ±90 degrees.

13. The apparatus according to claim 10, wherein the $\alpha$ comprises a time varying phase shift.

14. A digital frequency modulator, comprising:
a delay locked loop having a delay line with a plurality of tap outputs;
a tap selection processor that selects, from the delay line with the plurality of tap outputs, a sequence of time varying tap addresses $C_j(t)$ that vary in time in accordance with a modulating signal m(t); and
a multiplexer circuit, and wherein the time varying tap addresses $C_j(t)$ are applied to the multiplexer circuit to select a time varying sequence of tap outputs as a frequency modulated output signal $F_{out}(t)$ wherein the tap selection processor comprises an integrator that integrates the modulating signal m(t) and an adder that adds the integrated modulating signal m(t) to a selected sequence of tap addresses $C_j$ to produce $C_j(t)$.

15. The apparatus according to claim 14, wherein the time varying tap addresses $C_j(t)$ are further selected to amplitude modulate the output signal $F_{out}(t)$ in accordance with the modulating signal m(t).

16. The apparatus according to claim 14, wherein the time varying tap addresses C(t) are further selected to phase modulate the output signal $F_{out}(t)$ in accordance with the modulating signal m(t).

17. The apparatus according to claim 14, wherein the modulating signal m(t) comprises an analog signal.

18. The apparatus according to claim 14, wherein the modulating signal m(t) comprises a data signal.

19. A digital amplitude modulator, comprising:
a delay locked loop having a delay line with a plurality of tap outputs;
a tap selection processor that selects, from the delay line with the plurality of tap outputs, a sequence of time varying tap addresses $C_j(t)$ that vary in time in accordance with a modulating signal m(t);
a multiplexer circuit, and wherein the time varying tap addresses $C_j(t)$ are applied to the multiplexer circuit to select a time varying sequence of tap outputs as an output signal $F_{out}(t)$; and
wherein the tap selection processor comprises:
a first adder that adds the modulating signal m(t) to a selected sequence of tap addresses $C_{ja}$ to produce a first sequence of time varying tap addresses $C_{jb}(t)$;
a second adder that subtracts the modulating signal m(t) from the selected sequence of tap addresses $C_{ja}$ to produce a second sequence of time varying tap addresses $C_{jc}(t)$; and
wherein $C_j(t)$ comprises $C_{jb}(t)$ and $C_{jc}(t)$; and wherein the multiplexer circuit comprises:
a first multiplexer receiving the first sequence of time varying tap addresses $C_{jb}(t)$ to produce a first output signal $V_1(t)$; and
a second multiplexer receiving the second sequence of time varying tap addresses $C_{jc}(t)$ to produce a second output signal $V_2(t)$;
and further comprising:
a summation circuit that adds $V_1(t)$ to $V_2(t)$ to obtain an amplitude modulated output signal V(t).

20. The apparatus according to claim 19, wherein the adding circuit comprises an analog summation circuit.

21. The apparatus according to claim 20, wherein the summation circuit comprises a three state analog summation circuit.

22. The apparatus according to claim 21, wherein the three state analog summation circuit comprises a NAND gate and a NOR gate, each receiving V1(t) and V2(t) and producing first and second outputs therefrom; and a first and a second transistor connected in series and driven by the first and second outputs respectively to produce a three state output at a node coupling the first transistor with the second transistor.

23. The apparatus according to claim 19, wherein the time varying tap addresses $C_j(t)$ are further selected to frequency modulate the output signal $F_{out}(t)$ in accordance with the modulating signal m(t).

24. The apparatus according to claim 19, wherein the time varying tap addresses C(t) are further selected to phase modulate the output signal $F_{out}(t)$ in accordance with the modulating signal m(t).

25. The apparatus according to claim 19, wherein the modulating signal m(t) comprises an analog signal.

26. The apparatus according to claim 19, wherein the modulating signal m(t) comprises a data signal.

27. A method of producing multiple output frequencies using a delay locked loop having a delay line with a plurality of tap outputs, comprising:
selecting a first sequence of the tap outputs from the delay line having the plurality of tap outputs according to a first timing to produce a first output signal $F_{out1}$;
selecting a second sequence of the tap outputs from the delay line having the plurality of tap outputs according to a second timing to produce a second output signal $F_{out2}$.; and
applying addresses of the first sequence of tap outputs to a first multiplexer to perform selecting the first sequence of tap outputs; and
applying addresses of the second sequence of tap outputs to a second multiplexer to perform selecting-the second sequence of tap outputs; and
modulating the first sequence of tap outputs with the second sequence of tap outputs.

28. A method of producing two output signals differing by a phase shift in a delay locked loop circuit having a delay line with a plurality of addressable tap outputs, comprising:
selecting a first sequence of tap addresses $C_{ja}$;
adding a phase shift component $\Phi$ to the first sequence of tap addresses $C_{ja}$ to produce a second sequence of tap addresses $C_{jb}$; and
applying the first sequence of tap addresses $C_{ja}$ to a first multiplexer to produce a first output signal $F_{outa}$; and
applying the second sequence of tap addresses $C_{jb}$ to a second multiplexer to produce a second output signal $F_{outb}$, and wherein $F_{outa}$ differs from $F_{outb}$ by a phase shift related to $\Phi$.

29. The method according to claim 28, wherein the phase shift comprises ±90 degrees.

30. The method according to claim 28, wherein the phase shift component $\Phi$ comprises a time varying phase shift component.

31. A method of producing two output signals differing by a phase shift using a delay locked loop having a plurality of addressable delay line tap outputs, comprising:
selecting a sequence of tap addresses $C_{ja}$ from the delay locked loop having a delay line providing the plurality of addressable delay line tap outputs;
applying the sequence of tap addresses $C_{ja}$ to a plurality of inputs of a first multiplexer to produce a first output signal $F_{outa}$; and
applying the sequence of tap addresses $C_{ja}$ to a plurality of inputs of a second multiplexer to produce a second output signal $F_{outb}$;
wherein $F_{out1}$ differs from $F_{out2}$ by the phase shift, and wherein the phase shift is determined by a constant difference in address location selected by the sequence of tap addresses $C_{ja}$ between the first and second multiplexers.

32. The method according to claim 31, wherein the first and second multiplexers are connected to the tap outputs in a manner such that a tap address from the sequence of tap addresses selects an input corresponding to tap number L of the first multiplexer and corresponding to tap number L+$\Phi$ in the second multiplexer, where $\Phi$ is a phase shift normalized to a length of the delay line.

33. The method according to claim 32, wherein the sequence of tap addresses $C_{ja}$ is applied to the second multiplexer through a delay element.

34. The apparatus according to claim 31, wherein the phase shift corresponds to ±90 degrees.

35. The apparatus according to claim 31, wherein the phase shift comprises a time varying phase shift.

36. A method of providing digital frequency modulation in a delay locked loop circuit having a delay line with a plurality of tap outputs, comprising:

selecting a sequence of time varying tap addresses $C_j(t)$ that vary in time in accordance with a modulating signal m(t), wherein the selecting comprises:
  integrating the modulating signal m(t); and
  adding the integrated modulating signal m(t) to a selected sequence of tap addresses $C_j$ to produce $C_j(t)$; and
applying the time varying tap addresses $C_j(t)$ to a multiplexer circuit to select a time varying sequence of tap outputs as a frequency modulated output signal $F_{out}(t)$.

37. A method of providing digital amplitude modulation in a delay locked loop circuit having a delay line with a plurality of tap outputs, comprising:
  selecting a sequence of time varying tap addresses $C_j(t)$ that vary in time in accordance with a modulating signal m(t), wherein the selecting comprises:
    adding the modulating signal m(t) to a selected sequence of tap addresses $C_{ja}$ to produce a first sequence of time varying tap addresses $C_{jb}(t)$; and
    subtracting the modulating signal m(t) from the selected sequence of tap addresses $C_{ja}$ to produce a second sequence of time varying tap addresses $C_{jc}(t)$, wherein $C_j(t)$ comprises $C_{jb}(t)$ and $C_{jc}(t)$; and
  applying the time varying tap addresses $C_j(t)$ to a multiplexer circuit to select a time varying sequence of tap outputs as an amplitude modulated output signal $F_{out}(t)$.

38. The method according to claim 37, and wherein the applying comprises:
  applying the first sequence of time varying tap addresses $C_{jb}(t)$ to a first multiplexer to produce a first output signal $V_1(t)$; and
  applying the second sequence of time varying tap addresses $C_{jc}(t)$ to a second multiplexer produce a second output signal $V_2(t)$.

39. The method according to claim 38, further comprising adding $V_1(t)$ to $V_2(t)$ to obtain an amplitude modulated output signal V(t).

40. The method according to claim 39, wherein the adding is carried out in an analog summation circuit.

41. The method according to claim 40, wherein the analog summation circuit comprises a three state analog summation circuit.

42. A method of selecting delay line taps to produce an output signal from a delay locked loop, comprising:
  computing an tap address P.Q where P is an integer part and Q is a fractional part; and
  selecting a delay line tap address of P during a portion of an operational cycle and of P+1 during a remainder of the operational cycle, with the regularity of selection of P and P+1 determined by an algorithm that establishes an average value of the tap address as approximately P.Q.

43. The method according to claim 42, wherein the algorithm selects the value of P for 1-0.Q operational cycles and selects the value of P+1 for 0.Q operational cycles.

* * * * *